US007580197B2

(12) United States Patent
Omura et al.

(10) Patent No.: US 7,580,197 B2
(45) Date of Patent: Aug. 25, 2009

(54) PROJECTION OPTICAL SYSTEM AND METHOD FOR PHOTOLITHOGRAPHY AND EXPOSURE APPARATUS AND METHOD USING SAME

(75) Inventors: Yasuhiro Omura, Kumagaya (JP); Hironori Ikezawa, Fukaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/907,908

(22) Filed: Oct. 18, 2007

(65) Prior Publication Data
US 2008/0068724 A1 Mar. 20, 2008

Related U.S. Application Data

(63) Continuation of application No. 10/525,372, filed as application No. PCT/JP03/10665 on Aug. 22, 2003, now Pat. No. 7,362,508.

(30) Foreign Application Priority Data

Aug. 23, 2002 (JP) ............................. 2002-242925
May 19, 2003 (GB) ................................ 0311470.9

(51) Int. Cl.
G02B 1/06 (2006.01)
G02B 3/00 (2006.01)
G02B 17/00 (2006.01)
(52) U.S. Cl. .................... 359/665; 359/649; 359/726
(58) Field of Classification Search ............... 359/649, 359/676, 692, 726–736, 665, 666; 355/53, 355/67, 71; 353/100, 122
See application file for complete search history.

(56) References Cited

U.S. PATENT DOCUMENTS

| 4,346,164 A | 8/1982 | Tabarelli et al. ............. 430/311 |
| 4,480,910 A | 11/1984 | Takanashi et al. |
| 4,509,852 A | 4/1985 | Tabarelli et al. |
| 5,121,256 A | 6/1992 | Corle et al. |
| 5,610,683 A | 3/1997 | Takahashi |
| 5,825,043 A | 10/1998 | Suwa ......................... 250/548 |

(Continued)

FOREIGN PATENT DOCUMENTS

DE 221 563 A1 4/1985

(Continued)

OTHER PUBLICATIONS

Kawata et al; "Fabrication of 0.2 μm Fine Patterns Using Optical Projection Lithography with an Oil Immersion Lens"; Jpn. J. Appl. Phys. vol. 31 (1992) pp. 4174-4177; Part 1, No. 12B, Dec. 1992.

(Continued)

Primary Examiner—Mohammed Hasan
(74) Attorney, Agent, or Firm—Oliff & Berridge, PLC

(57) ABSTRACT

A liquid immersion optical system includes a first optically transparent member and a second optically transparent member, arranged in an optical path between the first optically transparent member and an object. A first space between the first optically transparent member and the second optically transparent member is fillable with a first liquid. A second space between the second optically transparent member and the object is fillable with a second liquid. The second optically transparent member is detachably arranged in the optical path between the first optically transparent member and the object.

29 Claims, 20 Drawing Sheets

U.S. PATENT DOCUMENTS

| | | | |
|---|---|---|---|
| 5,852,490 | A | 12/1998 | Matsuyama |
| 5,900,354 | A | 5/1999 | Batchelder |
| 6,020,964 | A | 2/2000 | Loopstra et al. |
| 6,166,865 | A | 12/2000 | Matsuyama |
| 6,191,429 | B1 | 2/2001 | Suwa |
| 6,198,576 | B1 | 3/2001 | Matsuyama |
| 6,961,186 | B2 | 11/2005 | Pierrat et al. |
| 7,317,507 | B2 * | 1/2008 | Straaijer ................. 355/53 |
| 7,414,794 | B2 | 8/2008 | Novak ................. 359/649 |
| 2001/0040722 | A1 | 11/2001 | Shafer et al. |
| 2003/0004757 | A1 | 1/2003 | Haines |
| 2003/0011755 | A1 | 1/2003 | Omura et al. |
| 2003/0030916 | A1 | 2/2003 | Suenaga |
| 2003/0174408 | A1 | 9/2003 | Rostalski et al. |
| 2005/0018164 | A1 | 1/2005 | Hansen |
| 2005/0068499 | A1 | 3/2005 | Dodoc et al. |
| 2005/0094119 | A1 * | 5/2005 | Loopstra et al. ............. 355/67 |
| 2006/0028630 | A1 | 2/2006 | Akimoto |

FOREIGN PATENT DOCUMENTS

| | | |
|---|---|---|
| DE | 224 448 A1 | 7/1985 |
| EP | 0 023 231 B1 | 2/1981 |
| EP | 0 605 103 B1 | 7/1994 |
| EP | 0 834 773 A2 | 4/1998 |
| JP | A-2002-244035 | 8/2002 |
| WO | WO 99/49504 | 9/1999 |
| WO | WO 03/077037 A1 | 9/2003 |
| WO | WO 2004/107048 A2 | 12/2004 |

OTHER PUBLICATIONS

Feuer et al; "Projection Photolithography-Liftoff Techniques for Production of 0.2 μm Metal Patterns"; IEEE Transactions On Electron Devices, vol. 28, No. 11, pp. 1375-1378, Nov. 1981.

Baek et al; "Simulation Study of Process Latitude for Liquid Immersion Lithography"; Optical Microlithography XVI, vol. 5040 (2003), pp. 1620-1630.

Hafeman et al; "Simulation of imaging and stray light effects in immersion lithography"; Optical Microlithography XVI, vol. 5040 (2003), pp. 700-712.

Kawata et al; "Optical Projection Lithography Using Lenses with Numerical Apertures Great than Unity"; Microelectronic Engineering 9 (1989), pp. 31-36.

Owa et al; "Immersion Lithography; its potential performance and issues"; Optical Microlithography XVI, vol. 5040 (2003), pp. 724-733.

Owen et al; "1/8 μm optical lithography"; J. Vac. Sci. Technol. B 10(6), Nov./Dec. 1992, pp. 3032-3036

Smith et al; "Water Immersion Optical Lithography for the 45nm Node"; Optical Microlithography XVI, vol. 5040 (2003), pp. 679-689.

Switkes et al; "Resolution enhancement of 157 nm lithography by liquid immersion"; $JM^3$ 1(3), Oct. 2002, pp. 225-228.

Ulrich et al; "The Development of Dioptric Projection Lenses for DUV Lithography"; International Optical Design Conference 2002, vol. 4832 (2002), pp. 158-169.

* cited by examiner

Lateral Aberration

//]: #

PROJECTION OPTICAL SYSTEM AND METHOD FOR PHOTOLITHOGRAPHY AND EXPOSURE APPARATUS AND METHOD USING SAME

This is a Continuation of application Ser. No. 10/525,372, which is the U.S. National Stage of International Application No. PCT/JP2003/010665 filed Aug. 22, 2003. The disclosure of each of the prior applications is hereby incorporated by reference herein in its entirety.

TECHNICAL FIELD

The present invention relates to projection optical systems such as systems for photolithography.

The present invention also relates to an exposure apparatus and exposing methods. The invention is applicable to a high-resolution projection optical system suitable for an exposure apparatus used when manufacturing semiconductor elements or liquid crystal display elements through a photolithographic process.

BACKGROUND ART

In the following the term "anastigmat" means an optical element or group of optical elements adapted to reduce astigmatism and/or aberrations including spherical aberration. See, e.g. Naumann/Schröder, Bauelemente der Optik, Carl Hauser Verlag München Wien, 6$^{th}$ ed., 1992, pp. 382-383 for a discussion of the term anastigmat. The term "Mangin mirror arrangement" means an optical device comprising a concave mirror and at least one negative powered lens proximal to the concave mirror wherein the concave mirror need not be in contact with the negative powered lens.

In the lithographic process for manufacturing semiconductor elements or the like, it is the usual practice to use a projection exposure apparatus for exposing a pattern image of a mask (or a reticle) onto a wafer (or a glass plate or the like) coated with photoresist via a projection optical system. Along with improvement of the degree of integration of semiconductor elements, the demand for achievable resolution of a projection optical system of the projection exposure apparatus is steadily increasing.

As a result, in order to satisfy the resolution requirement of the projection optical system, it is necessary to reduce the wavelength λ of the illuminating light (exposing light) and/or increase the numerical aperture NA of the projection optical system. More specifically, the resolution of a projection optical system is expressed by k·λ/NA (where k is a process coefficient). When assuming the refractive index of a medium (usually a gas such as air) between the projection optical system and the image field to be n, and the maximum incident angle to be θ, then, the numerical aperture NA on the image side can be expressed as n·sin θ.

Historically, resolution in microlithography has been improved either by increasing the numerical aperture (NA), or by reducing the wavelength of illumination light, or a combination of the two.

When it is tried to increase the numerical aperture by adopting a larger medium incident angle θ, the incident angle on the image plane and the outgoing angle from the projection optical system become larger, leading to an increase in reflection loss on the optical plane. It is impossible to ensure a large and effective numerical aperture on the image side. A technique is known for increasing the numerical aperture NA by filling an optical path between the projection optical system and the image field with a medium such as a liquid having a high refractive index. WO 99/49504 discloses a projection exposure method that irradiates exposure beams on a mask and transfers the pattern of said mask onto a substrate via a projection optical system, wherein when said substrate is moved along a predetermined direction, a predetermined liquid is passed along the direction of the motion of said substrate so as to fill the space between the end of the optical element on said substrate side of said projection optical system and the surface of said substrate, and discloses a projection exposure apparatus that irradiates exposure beams on a mask and transfers the pattern of said mask onto a substrate via a projection optical system, comprising a substrate stage that moves while holding said substrate, a liquid supply device that supplies a predetermined liquid along a predetermined direction via pipes for supply so as to fill the space between the end of the optical element of said substrate side of said projection optical system and the surface of said substrate, and a liquid recovery device that recovers said liquid from the surface of said substrate via said supply pipes and pipes for discharge arranged so as to sandwich the irradiation area of said exposure beams in said predetermined direction, and wherein when said substrate stage is driven to move said substrate along said predetermined direction, supply and recovery of said liquid is performed. The direction of the flow of the liquid may be changed according to the direction of the motion of the substrate. The projection exposure apparatus may be provided with a second pair of supply pipes and discharge pipes arranged at the location where said pair of supply pipes and discharge pipes would be if they were essentially rotated by 180°. The projection exposure apparatus may also comprise a liquid recovery device that recovers liquid supplied to between said projection optical system and said substrate.

U.S. Pat. No. 4,509,852 teaches using a photolithographic projection apparatus a mask having a pattern is imaged on a photosensitive layer coating a semiconductor substrate by a projection lens. To improve the resolving capability and to obviate adverse effects, e.g. standing waves and inhomogeneous exposure, the space between the substrate and the adjacent boundary face of a projection lens is filled during exposure with a transparent liquid having the same refractive index as the photosensitive layer.

However, a concrete proposal has not as yet been made regarding a configuration which ensures a large and effective image-side numerical aperture.

The theoretical resolution improvement of liquid-immersion is well known in microscopy, where oil-immersion dioptric objectives have for many years been designed with NAs greater than 1.0, but covering only a very small field of 0.5 mm or less. See, for example: "Modern Optical Engineering", by Warren Smith, Third Edition, page 450, published by SPIE Press and McGraw Hill.

Liquid immersion applied to microlithography has also been proposed for many years, but has been slow to be adopted in production, no doubt because of practical difficulties. However, the theoretical advantages become stronger as "dry" projection lens NAs approach the theoretical limit of 1.0. These advantages have been described in, for example: "The k3 coefficient in nonparaxial λ/NA scaling equations for resolution, depth of focus, and immersion lithography" by Burn J. Lin published in JM3 1(1) 7-12 April 2002.

More recent investigations into the practical issues of liquid immersion for lithography have also become more optimistic, for example: "Resolution enhancement of 157 nm lithography by liquid immersion" by M. Switkes and M.

Rothschild, published in JM3 1(3) 225-228 October 2002. However, neither of these papers addresses the issues of optical design.

Early papers proposing liquid immersion lithography include: "Optical projection lithography using lenses with numerical apertures greater than unity" by H. Kawata, J. M. Carter, A. Yen and H. I. Smith, published in Microelectronic, Eng. 9, 31 (1989); "Fabrication of 0.2 µm fine patterns using optical projection lithography with an oil immersion lens" by H. Kawata, I. Matsumura, H. Yoshida and K. Murata, published in Japan, Journal of Applied Physics, Part 131, 4174~1992; "⅛ µm optical lithography" by G. Owen, R. F. W. Pease, D. A. Markle, A. Grenville, R. L. Hsieh, R. von Bunau and N. I. Maluf, in the Journal of Vacuum Science Technology, B10-6, 3032~1992; and "Immersion lithography at 157 nm" by M. Switkes and M. Rothschild, in the Journal of Vacuum Science Technology, B19-6, 2353~2001.

The recent Switkes paper is the most significant, in that it proposes the use of water as the immersion liquid for ArF (or KrF) laser light, perfluoropolyethers for $F_2$ laser light, and starts to address the practical issues involved with a scanning wafer stage.

Another recent paper has started to address optical design issues for the relatively wide field of views used in lithography, partially disclosing liquid immersion dioptric microlithographic projection lens designs with NAs of greater than 1.0: "Development of dioptric projection lenses for DUV lithography" [4832-18] by Ulrich Wilhelm, Rostalski Hans-Juergen, Hudyma Russell M, published in SPIE Vol. 4832 IODC June 2002.

US 2001/0040722 A1 describes a catadioptric design which uses a V-fold mirror and two intermediate images. However, this is a small-field system (<1 mm), specifically intended for optical inspection, and there is no indication that the design could be applied to the much larger field sizes and extremely small residual aberrations and distortion required for microlithography.

"High numerical aperture lithographic imagery at the Brewster angle" by Timothy A. Brunner et al, in JM3 1(3) 188-196, October 2002, describes the fundamental disadvantages in terms of image quality, as the NA approaches 1.0 in a "dry" projection lens. These relate to vector imaging degradation that is made worse by Fresnel reflection losses at the resist interface, which more strongly reflects and loses the polarization orientation that would have given the better image quality inside the photoresist. This occurs most strongly at Brewster's angle, which corresponds to a NA of about 0.85.

We have investigated liquid immersion dioptric designs, and have found that for a NA of 1.0 and 26 mm field size the largest lens diameters need to be of the order of 330 mm, which is on the limit of available high quality fused silica, and beyond the limit for calcium fluoride. There is also a reduction in spectral bandwidth, in the same way that there is for "dry" dioptric lenses as the NA increases. A reduction in field size and an increase in reduction ratio above 4× would help these issues, but would make the "wet" lithography tools incompatible with current "dry" systems.

Known "dry" catadioptric designs have relatively small lens diameters and chromatic aberrations. However, they cannot be converted to liquid immersion only by adding a liquid to the space between the last element and the wafer. This would introduce a large amount of spherical aberration, which has to be compensated elsewhere in the design. Also, in simply adding a liquid, the NA does not increase, since the definition of NA already includes the refractive index.

Immersing the wafer in liquid is a necessary, but not sufficient, condition for being able to increase the NA up to the theoretical maximum equal to the liquid refractive index (~1.4), rather than 1.0 in a "dry" system. For a constant magnification, paraxial geometrical optics theory (in particular, the Lagrange invariant) dictates that an increase of NA at the wafer has to be accompanied by a corresponding increase in NA all the way through the projection lens system. This results in an increase in lens diameters, and optical surface steepness, defined by the ratio D/R, where D is the clear aperture diameter and R is the radius of curvature. At the same time, chromatic and high-order aberrations increase rapidly with NA.

It is therefore not obvious to one skilled in the art of optical design that the NA of a "dry" projection lens can be increased in the ratio of the refractive index of the immersion liquid, without both an impractical increase in the lens size and complexity, as well as an unacceptable increase in residual aberrations.

Textbooks on optical design (e.g. Warren Smith, Modern Optical Engineering Third Edition, page 449-450, published by SPIE Press and McGraw Hill) describe the historical microscope immersion objective with a hyper-hemispherical convex surface (clear diameter/radius of curvature beyond hemispherical, where D/R=2) on the last element, opposite the plane surface in contact with the immersion liquid. Classically, this surface is designed to be either aplanatic, or close to the aplanatic condition. At the aplanatic condition there is zero spherical aberration, coma and astigmatism, and the marginal ray convergence angle is greater inside the lens element than before it by the ratio of the glass refractive index. Being close to this aplanatic condition minimizes spherical aberration and coma, and is a simple way of increasing NA, which is useful for a small field microscope objective, or systems such as the prior art US Patent Application US 2001/0040722.

For microlithography, which requires small aberrations over a much larger field size, such an aplanatic surface would give rise to higher-order aberration variations across the field, including oblique spherical aberration and coma. It is common practice to use, instead, a convex surface on this last element that is not at the aplanatic condition, but rather at or near the so-called concentric, or monocentric condition. In the concentric situation the marginal ray convergence angle inside the last element is identical to that incident upon it. Again there is zero spherical aberration and coma, but more importantly for a wide-field system there is zero sagittal oblique spherical aberration. See, for example, J. Dyson, JOSA, volume 49(7), p. 713 (July 1959), or, "Monocentric telescopes for microlithography" by C. G. Wynne, Optical Engineering, Vol. 26 No. 4, 1987.

J. G. Baker, The Catadioptric Refractor, The Astronomical Journal, Vol. 59, pp. 74-84 (1955) discusses pros and cons of a telescope which is based on a concept suggested by Schupmann (L. Schupmann, Die Medial-Fernrohre, Eine neue Konstruktion für große astronomische Instrumente, Teubner, Leipzig, 1899).

SUMMARY OF THE INVENTION

An object of the invention is to provide a projection optical system which permits achievement of a large and effective image-side numerical aperture by providing a medium having a high refractive index in an optical path to the image field and inhibiting satisfactorily the reflection loss on the optical surface. Another object of the invention is to provide an exposure apparatus and an exposing method which have a large and effective image-side numerical aperture and enable to transfer and expose a fine pattern at a high accuracy via a projection optical system having a high resolution.

According to a first aspect of the invention there is provided a projection optical system for projecting an image of a first plane onto a second plane comprising: a boundary lens; and at least one layer of immersion medium between the boundary lens and the second plane; said boundary lens having a first plane side optical surface shaped such that for light projected onto the second plane through the boundary lens the marginal ray convergence angle prior to incidence is larger than the marginal ray convergence angle within said boundary lens.

According to a second aspect of the invention there is provided a projection optical system for projecting an image of a first plane to a second plane comprising: an optical system; a boundary lens; and at least one layer of immersion medium between said boundary lens and said second plane; wherein light from the first plane is transmitted through the optical system, and output with a predetermined marginal ray convergence angle; and said boundary lens is positioned to receive said light output from the optical system, and adapted such that for light projected onto the second plane through the boundary lens the marginal ray convergence angle prior to incidence is larger than the marginal ray convergence angle within said boundary lens.

The optical system (which means the optical system of the optical projection system, where the former is included in an optical projection system) may further comprise at least one positive powered lens element proximal to said boundary lens, and having an aspheric optical surface.

Alternatively, the optical system may further comprise a first positive powered lens element proximal to said boundary lens, and having at least one aspheric optical surface, and a second positive powered lens element between the first positive powered lens element and said boundary lens, and having at least one aspheric optical surface.

The optical system may be one in which the first positive powered lens element has an axial thickness greater than 26.1 mm and less than 28.9 mm, and a first plane side surface with an axial radius of curvature greater than 103 mm and less than 114 mm, the second positive powered lens element has an axial thickness greater than 26.5 mm and less than 29.3 mm, and a first plane side surface with an axial radius of curvature greater than 83.2 mm and less than 91.9 mm, and the boundary lens has an axial thickness greater than 41.6 mm and less than 46.0 mm, and a first plane side surface with an axial radius of curvature greater than 56.9 mm and less than 62.9 mm.

Instead, the optical system may comprise a first positive powered lens element proximal to said boundary lens, and having at least one aspheric optical surface, and a second positive powered lens element between the first positive powered lens element and said boundary lens, and having at least one aspheric optical surface, wherein the first positive powered lens element has an axial thickness greater than 27.22 mm and less than 27.77 mm, and a first plane side surface with an axial radius of curvature greater than 107.6 mm and less than 109.8 mm, the second positive powered lens element has an axial thickness greater than 27.63 mm and less than 28.19 mm, and a first plane side surface with an axial radius of curvature greater than 86.67 mm and less than 88.42 mm, and the boundary lens has an axial thickness greater than 43.37 mm and less than 44.25 mm, and a first plane side surface with an axial radius of curvature greater than 59.27 mm and less than 60.46 mm.

Any of the optical systems defined above may include a double-Gauss anastigmat arranged to reduce spherical aberration including a third positive powered lens element, a first negative powered lens element, a second negative powered lens element, and a fourth positive powered lens element.

In this optical system the third positive powered lens element has an axial thickness greater than 43.9 mm and less than 48.5 mm, and a first plane side surface with an axial radius of curvature greater than 128 mm and less than 141 mm, the first negative powered lens element has an axial thickness greater than 13.1 mm and less than 11.9 mm, and a first plane side surface with an axial radius of curvature greater than 1540 mm and less than 1710 mm, the second negative powered lens element has an axial thickness greater than 11.9 mm and less than 13.1 mm, and a first plane side surface with an axial radius of curvature greater than 184 mm and less than 204 mm, and the fourth positive powered lens element has an axial thickness greater than 30.6 mm and less than 33.9 mm, and a second plane side surface with an axial radius of curvature greater than 189 mm and less than 209 mm.

As an alternative to the optical system described in the preceding paragraph, the optical system may be one in which the third positive powered lens element has an axial thickness greater than 45.71 mm and less than 46.63 mm, and a first plane side surface with an axial radius of curvature greater than 133.3 mm and less than 136.0 mm, the first negative powered lens element has an axial thickness greater than 12.38 mm and less than 12.63 mm, and a first plane side surface with an axial radius of curvature greater than 1608 mm and less than 1641 mm, the second negative powered lens element has an axial thickness greater than 12.38 mm and less than 12.63 mm, and a first plane side surface with an axial radius of curvature greater than 191.9 mm and less than 195.8 mm, and the fourth positive powered lens element has an axial thickness greater than 31.91 mm and less than 32.56 mm, and a second plane side surface with an axial radius of curvature greater than 197.4 mm and less than 201.3 mm.

The optical system in any form as described above may comprise a catadioptric anastigmat comprising a concave mirror and at least one negative powered Schupmann lens.

In this optical system the catadioptric anastigmat can comprise two negative powered Schupmann lenses.

Any of the above optical systems may be adapted for use with ultraviolet light.

The optical system may comprise a set of optical elements substantially having the parameters as set out in Tables 1 and 2.

The optical system may comprise a set of optical elements having parameters substantially based on those in Tables 1 and 2, but adjusted to be re-optimised for a particular operating optical wavelength According to a third aspect of the invention there is provided a method of projecting an image of a first plane onto a second plane including the steps of passing light having a first marginal ray convergence angle to a boundary lens, passing light having a second marginal ray convergence angle though the boundary lens, and passing light from said boundary lens through a layer of immersion liquid to the second plane, wherein the first marginal ray convergence angle is greater than the second marginal ray convergence angle.

The method may include the step of passing light through at least one positive powered lens element proximal to said boundary lens, and having an aspheric optical surface.

Alternatively, the method may include the steps of passing light through a first positive powered lens element proximal to said boundary lens, and having at least one aspheric optical surface, and passing light through a second positive powered lens element between the first positive powered lens element and said boundary lens, and having at least one aspheric optical surface. This method may include the steps of passing light through a first positive powered lens element proximal to said boundary lens, and having at least one aspheric optical surface, passing light through a second positive powered lens element between the first positive powered lens element and said boundary lens, and having at least one aspheric optical surface, passing light through the first positive powered lens element having an axial thickness greater than 26.1 mm and less than 28.9 mm, and a first plane side surface with an axial radius of curvature greater than 103 mm and less than 114 mm, passing light through the second positive powered lens element having an axial thickness greater than 26.5 mm and less than 29.3 mm, and a first plane side surface with an axial radius of curvature greater than 83.2 mm and less than 91.9 mm, and passing light through the boundary lens having an axial thickness greater than 41.6 mm and less than 46.0 mm, and a first plane side surface with an axial radius of curvature greater than 56.9 mm and less than 62.9 mm. Alternatively the method may include the steps of passing light through a first positive powered lens element proximal to said boundary lens, and having at least one aspheric optical surface, passing light through a second positive powered lens element between the first positive powered lens element and said boundary lens, and having at least one aspheric optical surface, passing light through the first positive powered lens element having an axial thickness greater than 27.22 mm and less than 27.77 mm, and a first plane side surface with an axial radius of curvature greater than 107.6 mm and less than 109.8 mm, passing light through the second positive powered lens element having an axial thickness greater than 27.63 mm and less than 28.19 mm, and a first plane side surface with an axial radius of curvature greater than 86.67 mm and less than 88.42 mm, and passing light through the boundary lens having an axial thickness greater than 43.37 mm and less than 44.25 mm, and a first plane side surface with an axial radius of curvature greater than 59.27 mm and less than 60.46 mm.

The methods as defined above may include the step of passing light through a double-Gauss anastigmat arranged to reduce spherical aberration including a third positive powered lens element, a first negative powered lens element, a second negative powered lens element, and a fourth positive powered lens element. Such methods may include the step of passing light through a double-Gauss anastigmat arranged to reduce spherical aberration including a third positive powered lens element having an axial thickness greater than 43.9 mm and less than 48.5 mm, and an object side surface with an axial radius of curvature greater than 128 mm and less than 141 mm, a first negative powered lens element having an axial thickness greater than 13.1 mm and less than 11.9 mm, and a first plane side surface with an axial radius of curvature greater than 1540 mm and less than 1710 mm, a second negative powered lens element having an axial thickness greater than 13.1 mm and less than 11.9 mm, and a first plane side surface with an axial radius of curvature greater than 184 mm and less than 204 mm, and a fourth positive powered lens element has having axial thickness greater than 30.6 mm and less than 33.9 mm, and a second plane side surface with an axial radius of curvature greater than 189 mm and less than 209 mm. Instead the method may have the step of passing light through a double-Gauss anastigmat arranged to reduce spherical aberration including a third positive powered lens element having an axial thickness greater than 45.71 mm and less than 46.63 mm, and a first plane side surface with an axial radius of curvature greater than 133.3 mm and less than 136.0 mm, a first negative powered lens element having an axial thickness greater than 12.38 mm and less than 12.63 mm, and a first plane side surface with an axial radius of curvature greater than 1608 mm and less than 1641 mm, a second negative powered lens element has an axial thickness greater than 12.38 mm and less than 12.63 mm, and a first plane side surface with an axial radius of curvature greater than 191.9 mm and less than 195.8 mm, and a fourth positive powered lens element has an axial thickness greater than 31.91 mm and less than 32.56 mm, and a second plane side surface with an axial radius of curvature greater than 197.4 mm and less than 201.3 mm.

Any of the methods as defined above according to the third aspect of the invention may include the step of passing light through a catadioptric anastigmat comprising a concave mirror and at least one negative powered Schupmann lens, and this method may have the step of passing light through a catadioptric anastigmat comprising a concave mirror and two negative powered Schupmann lenses.

The light as used in the methods as defined above may be a beam of ultraviolet light.

The method may include the step of passing light through a set of optical elements having substantially the optical properties as set out in Tables 1 and 2.

The method may have the step of passing light through a set of optical elements substantially having optical properties based on those set out in Tables 1 and 2 but re-optimized for a particular operating wavelength.

The method may include the step of passing light through a set of optical elements substantially having optical properties based on those set out in Tables 1 and 2 but re-optimized for a particular operating wavelength and a particular immersion layer thickness.

According to a fourth aspect of the present invention there is provided a projection optical system for projecting an image of a first plane onto a second plane, comprising:

an optical path having a plurality of lenses including a boundary lens which is arranged at a position closest to the second plane, wherein the first plane side surface of the boundary lens has a positive refractive power, and for an atmosphere in said optical path having a refractive index of 1, the optical path between the boundary lens and the second plane is filled with a medium having a refractive index larger than 1.1.

According to a preferred embodiment of the fourth aspect, the projection optical system satisfies the condition as expressed by:

$$0.012 < Cb \cdot D/NA < 0.475$$

where, $Cb$ represents the curvature of a face of the boundary lens on the first plane side; $D$ represents the distance between an optical axis and the outermost point of an effective image forming area, and $NA$ represents the numerical aperture on the second plane side. It is desirable that, in the projection optical system, at least one optical member having substantially no refractive power is detachably arranged in the optical path between the boundary lens and the second plane; and the optical path between the boundary lens and the optical member, and the optical path between the optical member and the second plane are filled with said medium. In this case, the optical member having substantially no refractive power has an adjustable posture. The condition $|P \cdot D| < 1.0 \times 10^{-4}$ should preferably be satisfied, where, $P$ represents the refractive power of the optical member having substantially no refractive power; and $D$ represents the distance between the optical axis and the outermost point of the effective image forming area.

It is desirable that the projection optical system is a reflecting/refracting optical system comprising at least one concave reflector and a refractive optical member. In this case, the projection optical system should preferably have an effective image forming area eccentric relative to the optical axis, and at least one intermediate image should preferably be formed in the optical path of the projection optical system. It is desirable that the projection optical system comprises: a first image forming optical system for forming a first intermediate image on the first plane; a second image forming optical system, having at least one concave reflector, for forming a second intermediate image on the basis of the first intermediate image; and a third image forming optical system for forming a final image on the second plane on the basis of the flux from the second intermediate image; wherein a first deflecting mirror is arranged in the optical path between the first image forming optical system and the second image forming optical system; a second deflecting mirror is arranged in an optical path between the second image forming optical system and the third image forming optical system; and the optical axis of the first image forming optical system is aligned with the optical axis of the third image forming optical system.

The numerical aperture on the first plane side should preferably be 0.22 or larger. The light quantity loss occurring upon passing through the medium should preferably be 50% or lower.

A fifth aspect of the present invention provides an exposure apparatus comprising an illuminating system for illuminating a mask set on the first plane, and a projection optical system for forming an image of a pattern formed on the mask on a photosensitive substrate set on the second plane.

A sixth aspect of the present invention provides an exposing method comprising the steps of illuminating a mask set on the first plane, and projecting and exposing a pattern image formed on the mask on a photosensitive substrate set on the second plane via the projection optical system.

A seventh aspect of the present invention provides an exposure apparatus for transferring a pattern formed on a mask onto a photosensitive substrate comprising an illuminating optical system for illuminating a prescribed illumination area on the mask, and a projection optical system for projecting a reduced image of the pattern into an exposure area on the photosensitive substrate; wherein the projection optical system is a reflection/refraction optical system comprising a boundary lens arranged at a position the closest to the photosensitive substrate side; the exposure area is eccentric from the optical axis of the reflection/refraction-type projection optical system; and when the atmosphere in an optical path of the projection optical system is assumed to have a refractive index of 1, an optical path between the boundary lens and the second face is filled with a medium having a refractive index larger than 1.1.

In some aspects of the projection optical system of the present invention, the image-side numerical aperture NA is increased by providing a medium having a refractive index larger than 1.1 in an optical path between the boundary lens arranged at a position the closest to the image side (second plane side). The paper "Resolution Enhancement of 157-nm Lithography by Liquid Immersion" published by M. Switkes and M. Rothchild in JM3 1(3), pp 225-228, October 2002 identifies Florinat (perfluoropolyethers: commercial name by Three-M Company, the United States) and deionized water as media having a prescribed transmissivity for a beam having a wavelength λ of 200 nm or less.

The projection optical system of the present invention may reduce the reflection loss on the optical surface, and finally ensure a large and effective image-side numerical aperture by imparting positive refraction power to the face of the boundary lens on the object side (first plane side). In the present invention, as described below, it is possible to achieve a projection optical system which enables to keep a large and effective image-side numerical aperture by inhibiting the reflection loss on the optical surface to a satisfactory level by providing a medium having a high refractive index in the optical path to the image field.

The following conditional formula (1) should preferably be satisfied. In this formula, $C_b$ represents a curvature of the face of the boundary lens facing the object; D, the distance between the optical axis and the outermost point of the effective image forming area (in the case of an exposure apparatus, the distance between the optical axis and the outermost point of the effective exposure area); NA, the numerical aperture on the image side (the second plane side). The terms "effective image forming area" and "effective exposure area" mean an image forming area and an exposure area, of which the aberrations have been sufficiently corrected.

$$0.012 < C_b \cdot D/NA < 0.475 \tag{1}$$

A value exceeding the upper limit of the conditional formula (1) is not desirable because correction of aberration cannot sufficiently be accomplished over the entire effective image forming area (effective exposure area). A value lower than the lower limit of the conditional formula (1) is not desirable because a sufficient reduction of reflection loss on the optical surface cannot be achieved, leading to a smaller effective numerical aperture, and finally to a poorer resolution. In order to further reduce the reflection loss and an absorption loss and obtain a high resolution over the entire effective image forming area (effective exposure area), it is desirable to set an upper limit of the conditional formula (1) of 0.400, and a lower limit of 0.015.

As described above, a fluorine-based inert liquid such as Florinat or a liquid such as deionized water is used as a medium having a high refractive index provided between the boundary lens between the boundary lens and the image field so as to make it possible to ensure a required transmissivity (to inhibit a light quantity loss). In the case of an exposure apparatus, the liquid may suffer from contamination by the photoresist coated onto a substrate such as a wafer. The contaminated liquid may stain the image-side optical surface of the boundary lens, causing a decrease in transmissivity of the boundary lens and the liquid.

Therefore, it is desirable to detachably arrange an optical member (usually an optical member having substantially no refracting power) such as a parallel flat sheet in an optical path between the boundary lens and the image field. In the manufacturing process of a projection optical system, it is possible to adjust the Petzval sum and correct curvature of the image plane by selectively replacing the optical member provided between the boundary lens and the image field.

It is furthermore desirable to adopt a configuration so as to permit adjustment of the orientation of the optical member having substantially no refractive power. In this case, asymmetrical aberration caused by lens eccentricity can be corrected by tilting the optical member relative to the optical axis. The optical member having substantially no refractive power should preferably satisfy the following conditional formula (2):

$$|P \cdot D| < 1.0 \times 10^{-4} \tag{2}$$

In the conditional formula (2), P represents the refractive power of an optical member having substantially no refractive power (=1/focal length); and D, the distance between the optical axis and the outermost point of the effective image forming area (in the case of an exposure apparatus, the distance between the optical axis and the outermost point of the effective exposure area). A value higher than the upper limit of the conditional formula (2) is not desirable because it leads to large changes in the other aberrations upon correcting the asymmetrical aberration by tilting the optical member.

The projection optical system should preferably comprise a reflection/refraction optical system having at least one concave reflector and a refractive optical member (lens component). This configuration permits achievement of a projection optical system having a large effective image forming area (effective exposure area) and a large image-side numerical aperture NA. In general, in the case of a refractive-type projection optical system comprising a refractive optical member alone, it is necessary to bring the Petzval sum as close to 0 as possible by alternately arranging a positive lens group and a negative lens group on the object side (near the object surface) of a smaller numerical aperture, in order to correct the field curvature.

However, in an optical system having a large image-side numerical aperture, the numerical aperture is large also on the object side. It is therefore difficult to satisfactorily correct spherical aberration or coma over the entire effective image forming area (effective exposure area) while correcting the Petzval sum to 0. In this case, by altering the reduction magnification from 1:4 to a reduction at higher magnification such as 1:5 or 1:6, correction of the Petzval sum can be achieved because the object-side numerical aperture becomes smaller. However, when trying to ensure a wider effective exposure area in an exposure apparatus, this practice encounters the difficulty of requiring an excessively large mask.

In a reflection/refraction-type projection optical system having at least one concave reflector and a refractive optical system, in contrast, the concave reflector makes a contribution to the Petzval sum similar to that of a negative lens while having a positive refractive power. Correction of the Petzval sum can be easily made through a combination of the concave reflector and the positive lens. As a result, it is possible to achieve a projection optical system having a large image-side numerical aperture and a wide effective image forming area (effective exposure area) by a combination of a configuration of the reflection/refraction optical system and a configuration of a liquid-immersion optical system in which a liquid (medium) having a high refractive index is provided in the optical path from the image plane.

In the reflection/refraction optical system, a problem is how to separate a beam directed toward the concave reflector from a return beam reflected from the concave reflector. In a projection optical system having a large image-side numerical aperture, increase in the effective diameter of the optical element (adoption of larger optical elements) is inevitable. Therefore, in a reflection/refraction optical system using a prism-type beam splitter having a transmission reflection surface, the difficulty is encountered that it is difficult to manufacture a larger-sized prism-type beam splitter. The projection optical system should preferably have a configuration in which the system has an effective image forming area eccentric from the optical axis, and at least one intermediate image is formed in the optical path. In this configuration, it is possible to easily separate the beam directed toward the concave reflector from the return beam reflected from the concave reflector by arranging a flat reflector for separating the optical paths near the forming position of the intermediate image.

Furthermore, the configuration should preferably be such that the projection optical system comprises a first image forming optical system which forms a first intermediate image of the object surface (the first plane); a second image forming optical system which has at lease one concave reflector and forms a second intermediate image on the basis of the flux from the first intermediate image; and a third image forming optical system which forms a final image on an image field (the second plane) on the basis of the flux from the second intermediate image; a first deflection mirror is arranged in an optical path between the first image forming optical system and the second image forming optical system; a second deflection mirror is arranged in an optical path between the second image forming optical system and the third image forming optical system; and the optical axis of the first image forming optical system agrees with the optical axis of the third image forming optical system. In this configuration, even in an optical system having a large image-side numerical aperture, it is possible to easily separate the beam directed toward the concave reflector from the beam reflected by the concave reflector to return. It is also possible to relatively easily accomplish assembly or adjustment of optical systems since the first image forming optical system and the third image forming optical system are coaxial.

As described above, a projection optical system conducting size reduction at a high magnification such as 1:5 or 1:6 is unfavorable in that application to an exposure apparatus results in a mask larger in size. Therefore, the object-side numerical aperture should preferably be 0.22 or larger for obtaining a high resolution at an appropriate reduction magnification. In addition, the light quantity loss caused upon passing through a medium present between the boundary lens and the image field should preferably be 50% or lower. When this configuration requirement is not satisfied, light absorbed by the medium generates heat, and image formation tends to deteriorate under the effect of the fluctuation of the refractive index in the medium.

For a better understanding of the invention, and to show how the same may be carried into effect, reference will now be made, by way of example, to the accompanying drawings in which:

BEST MODE FOR CARRYING OUT THE INVENTION

Figure 1:
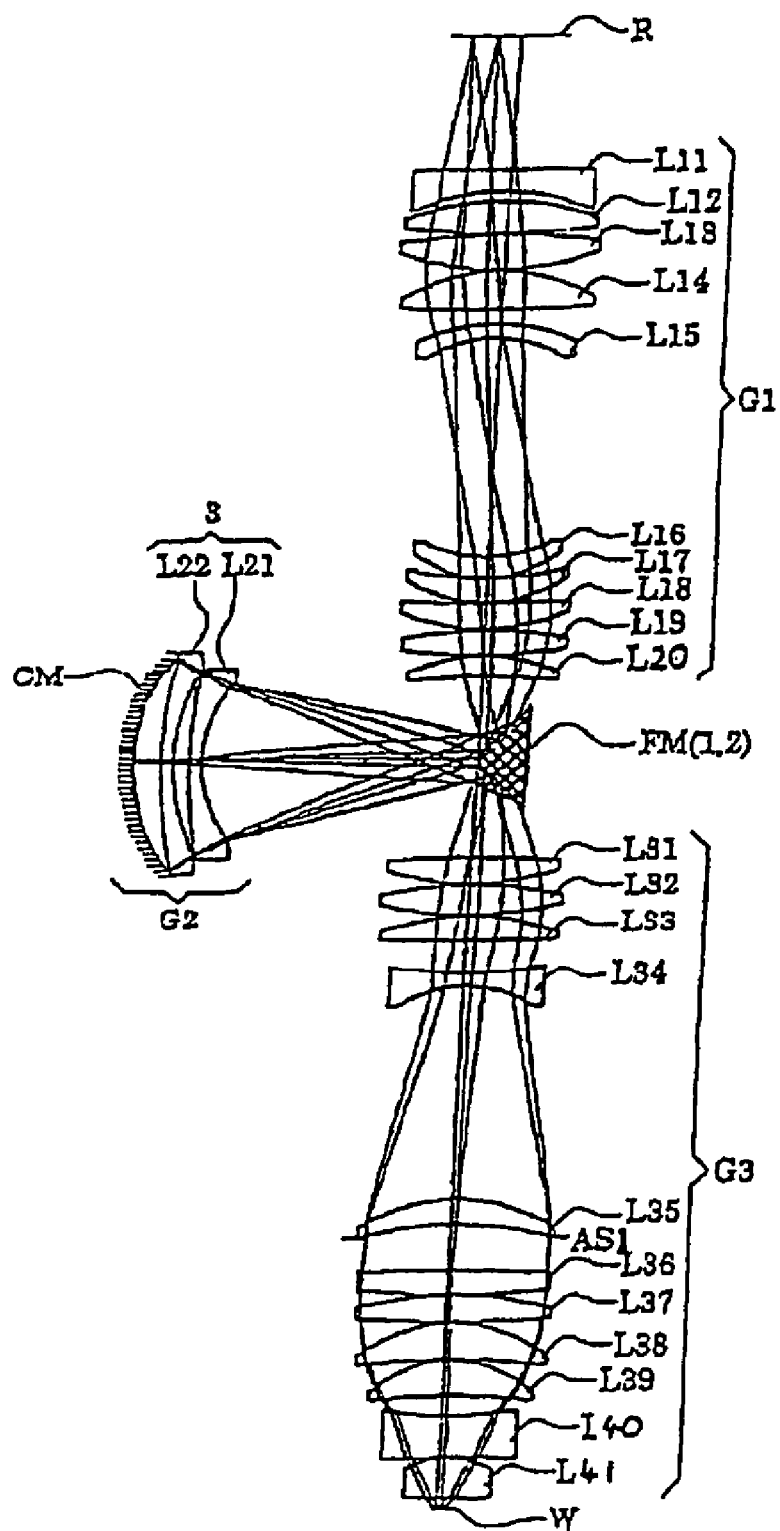
FIG. 1 shows an illustration of a catadioptric "dry" projection system for comparison purposes.

FIG. 1 is an illustration of a catadioptric "dry" projection system for comparison purposes, which was disclosed in EP1191378A1. This "dry" projection system includes a first set of field lens elements L11 to L13, a meniscus anastigmat L14 to L17 which aids in correcting aberrations, and a positive powered set of lens elements L18 to L20, which together comprise a first field lens group G1, a beam splitting means FM(1, 2), a Mangin mirror arrangement G2 including two Schupmann lenses L21, L22 and a concave mirror CM which provides an aberration correcting function. The system also includes a positive powered set of lens elements L31 to L33, a negative lens element L34, a positive powered set of lens elements L35 and L39, a negative powered anastigmat L40 which corrects aberrations, and a positive powered lens element L41 which together comprise a second field lens group G3. Light is passed from a reticle R through the first field lens group G1, then through the beam splitter FM(1, 2) to Mangin mirror arrangement G2, and finally through the beam splitter FM(1, 2) and the second field lens group G3. By this arrangement an image may be conveyed from the reticle R to a wafer W with negative magnification so as to controllably expose a photoresist on the wafer.

Figure 2:
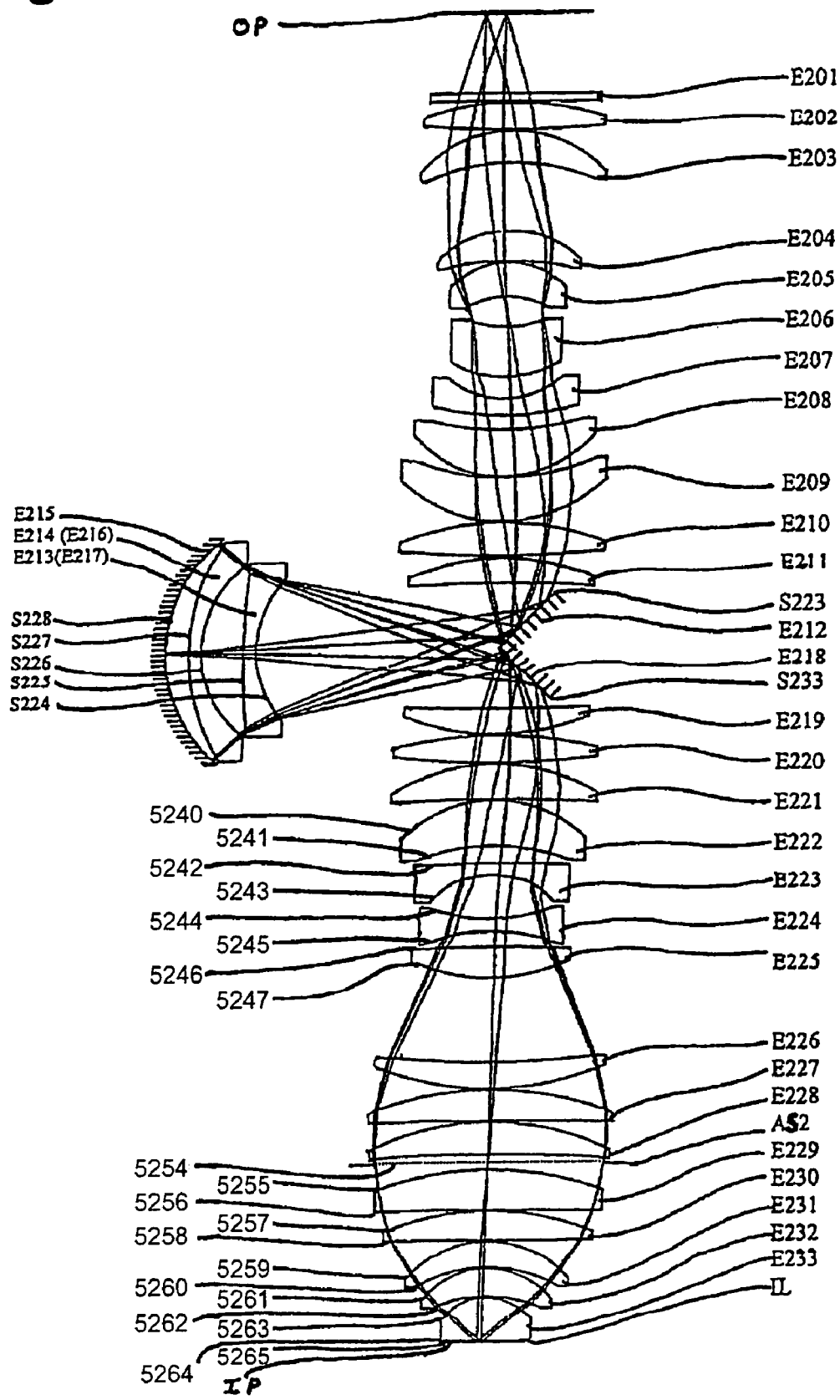
FIG. 2 shows an illustration of a catadioptric liquid immersion projection lens system according to a first embodiment of the present invention.
Figure 3:
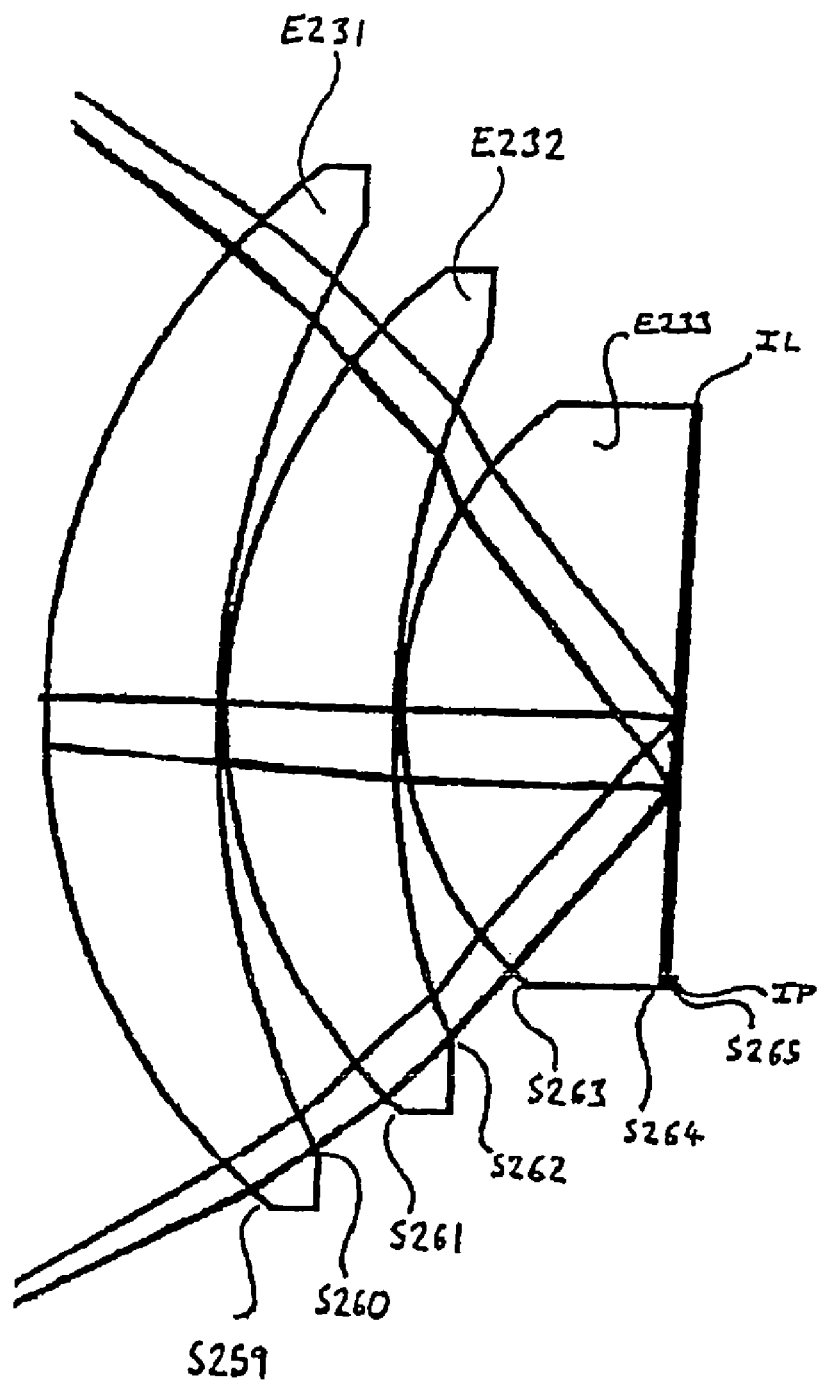
FIG. 3 shows an illustration of the last optical elements in the optical path of FIG. 2.

FIGS. 2 and 3 and Tables 1 and 2 show a detailed embodiment of the invention. Light from the object plane OP passes through a plane window E201, a first positive powered group of field lens elements E202 and E203, an anastigmat E204 to E208, adapted to reduce spherical aberration, a second positive powered group of field lens elements E209 to E211, a beam splitter E212 and E218, a catadioptric anastigmat including two Schupmann lenses E213 and E214 and a concave mirror E215, the beam splitter E212 and E218 for a second time, a third positive powered group of field lens elements E219 to E221, a double-Gauss anastigmat E222 to E225 arranged to reduce spherical aberration, a fourth positive powered group of field lens elements E226 to E232, a boundary lens E233, a layer of immersion liquid IL, and to an image plane IP.

The fourth positive powered group of field lens elements includes a first positive powered lens element E231, and a second positive powered lens element E232. The double-Gauss anastigmat includes a third positive lens element E222, a first negative powered lens element E223, a second negative powered lens element E224, and a fourth positive powered lens element E225.

In Tables 1 and 2 preferred values of the radius of curvature and the axial distances between optical surfaces of optical elements E210 to E233 are given. As those skilled in the art will appreciate, workable systems may be designed in which all the parameters given in Tables 1 and 2 may be allowed to vary from the specific values given by plus or minus 1 percent, and even up to plus or minus 5 percent with appropriate adaptation. For example when operating at 157 nm this would give for surface S263 a radius of curvature greater than 56.9 mm and less than 62.9 mm, or more preferably greater than 59.27 mm and less than 60.46 mm, or most preferably 59.8643 mm. The values for the radius of curvatures of the curved surfaces of the optical elements E202 to E233 and for the thicknesses and separations of the optical elements E202 to E211, E213 to E215, and E219 to E233 will of course change if the operating wavelength is changed.

Accordingly, the thicknesses of lens elements E222 to E225 and E231 to E233, and the radius of curvatures of optical surfaces S240, S242, S244, S247, S259, S261 and S263 may have values as follows:

the first positive powered lens element E231 has an axial thickness greater than 26.1 mm and less than 28.9 mm, and an object side surface S259 with an axial radius of curvature greater than 103 mm and less than 114 mm;

the second positive powered lens element E232 has an axial thickness greater than 26.5 mm and less than 29.3 mm, and an object side surface S261 with an axial radius of curvature greater than 83.2 mm and less than 91.9 mm;

the boundary lens E233 has an axial thickness greater than 41.6 mm and less than 46.0 mm, and an object side surface S263 with an axial radius of curvature greater than 56.9 mm and less than 62.9 mm;

the third positive powered lens element E222 has an axial thickness greater than 43.9 mm and less than 48.5 mm, and an object side surface S240 with an axial radius of curvature greater than 128 mm and less than 141 mm;

the first negative powered lens element E223 has an axial thickness greater than 11.9 mm and less than 13.1 mm, and an object side surface S242 with an axial radius of curvature greater than 1540 mm and less than 1710 mm;

the second negative powered lens element E224 has an axial thickness greater than 11.9 mm and less than 13.1 mm, and an object side surface S244 with an axial radius of curvature greater than 184 mm and less than 204 mm; and the fourth positive powered lens element E225 has an axial thickness greater than 30.6 mm and less than 33.9 mm, and an image side surface S247 with an axial radius of curvature greater than 189 mm and less than 209 mm.

More preferably, the ranges of values for the parameters of the optical projection system are within a narrower range of plus or minus 1% of the tabulated finite values.

Accordingly, the thicknesses of lens elements E222 to E225 and E231 to E233, and the radius of curvatures of optical surfaces S240, S242, S244, S247, S259, S261 and S263 may preferably have values as follows when operating at a wavelength of 157 nm:

the first positive powered lens element E231 has an axial thickness greater than 27.22 mm and less than 27.77 mm, and an object side surface S259 with an axial radius of curvature greater than 107.6 mm and less than 109.8 mm;

the second positive powered lens element E232 has an axial thickness greater than 27.63 mm and less than 28.19 mm, and an object side surface S261 with an axial radius of curvature greater than 86.67 mm and less than 88.42 mm;

the boundary lens E233 has an axial thickness greater than 43.37 mm and less than 44.25 mm, and an object side surface S263 with an axial radius of curvature greater than 59.27 mm and less than 60.46 mm;

the third positive powered lens element E222 has an axial thickness greater than 45.71 mm and less than 46.63 mm, and an object side surface S240 with an axial radius of curvature greater than 133.3 mm and less than 136.0 mm;

the first negative powered lens element E223 has an axial thickness greater than 12.38 mm and less than 12.63 mm, and an object side surface S242 with an axial radius of curvature greater than 1608 mm and less than 1641 mm;

the second negative powered lens element E224 has an axial thickness greater than 12.38 mm and less than 12.63 mm, and an object side surface S244 with an axial radius of curvature greater than 191.9 mm and less than 195.8 mm; and the fourth positive powered lens element E225 has an axial thickness greater than 31.91 mm and less than 32.56 mm, and an image side surface S247 with an axial radius of curvature greater than 197.4 mm and less than 201.3 mm.

Even more preferably, the values of the radius of curvature of the surfaces of the optical elements E201 to E233, and the thicknesses of the optical elements E201 to E233, have values according to Tables 1 and 2.

Figure 4:
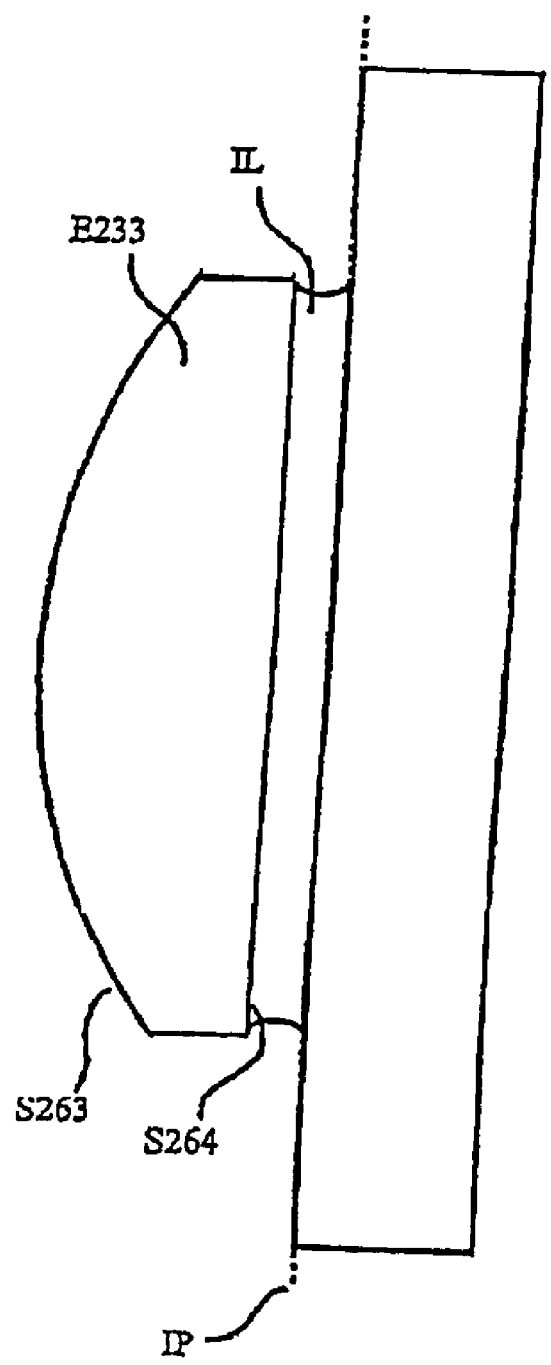
FIG. 4 shows an illustration of the boundary lens, the immersion liquid layer and the image plane.

An important feature is the presence of a liquid (other than glass) between the image side surfaces S264 of the boundary lens 233 and the image plane IP, both of which may be plane (infinite radius of curvature) as illustrated in FIG. 4. It should be noted that liquids other than water, such as perfluoropolyether, may be used in some embodiments and that the use of the term "liquid" is meant to include any fluid medium other than glass, having a refractive index substantially greater than 1. Suitable liquids include water, (which may be de-ionized and/or degassed) and perfluoropolyethers.

This embodiment of the invention provides improved resolution compared with the dry microlithographic projection system of FIG. 1, in which the wafer is immersed in a gas. The wafer is immersed in liquid, which reduces the speed and wavelength of light incident on the photoresist by a factor of about 1.4, without changing the wavelength of the light source. It thereby allows numerical apertures (NA) significantly greater than 1.0, by avoiding the total internal reflection of light that would have occurred at the last lens surface if the wafer had been immersed in a gas of refractive index close to 1.0.

The illustrated embodiment provides a specific "wet" catadioptric optical design at NA 1.2, a factor of about 1.4 times higher than "dry" designs at NA 0.85 such as FIG. 1. This disclosed catadioptric design also avoids some of the practical limitations of prior art dioptric "dry" immersion optical designs.

In this system, the theoretical advantages of liquid immersion are realized by means of a catadioptric large-field deep ultraviolet microlithographic projection optical design, whose NA is increased beyond the theoretical limit in air of 1.0, without the lens diameters or surface curvatures increasing beyond practical fabrication limits, and also without a reduction in field size or spectral bandwidth of light source that would occur with prior art dioptric designs. The "wet" catadioptric NA 1.2 design has a track length (reticle-wafer distance) comparable to a "dry" catadioptric NA 0.85 design, and the same instantaneous wafer field size of 26×5 mm and a relatively small increase in lens diameters, which minimizes the changes required in the lithography scanner tool body design, while allowing the same scanned fields to be covered over the wafer.

A catadioptric design is preferred (although it is not essential) because it does not require large separation of negative and positive powered lens elements for field curvature correction. Instead, the field is flattened by means of a concave positive powered mirror (element E215 in FIG. 2 and Tables 1 and 2). Negative powered lens elements close to this mirror (so-called Schupmann lenses, elements E213 and E214 in FIG. 2 and Tables 1 and 2) provide further field curvature correction and sufficient achromatization for the NA to be increased above 1.0 without the need for a second type of refracting material or a reduction in spectral bandwidth. This allows the design to be optimized for existing 0.4 pm bandwidth line-narrowed ArF excimer lasers, using only fused silica lens elements, no calcium fluoride elements, and deionized water of about 1 mm thickness as the immersion medium (IL in FIG. 2 and Tables 1 and 2).

It would be straightforward to re-optimize the disclosed design for use with a line-narrowed KrF laser. The design concept may also be applied to an $F_2$ excimer laser, using only calcium fluoride lens elements with for example a 0.1 mm thickness of perfluoropolyether immersion liquid layer.

Many types of prior art "dry" catadioptric designs have been designed and published. However, this invention is most closely related to, but not limited to, what may be described as the "V-type" catadioptric optical design form, which uses V-shaped fold mirrors between two intermediate images. This form has the advantage of relatively small lens diameters and a mechanical package similar to a dioptric lens. It should however be noted that alternatives exist to the V-shaped fold mirror, such as a splitter cube which has an equivalent effect.

In order to operate effectively with liquid immersion between the last lens element surface and the wafer, this last optical surface should preferably be a plane surface (surface S264 in FIGS. 2 and 4 and Tables 1 and 2). This facilitates the liquid dynamics during wafer scanning, minimizes the possibility of bubble formation within the liquid, and minimizes sensitivity to magnification changes with liquid refractive index and dispersion (lateral color), since for a telecentric system in wafer space the principal rays enter the liquid at zero angle of incidence.

In a classical liquid immersion microscope objective, the refractive index difference between the last lens element and liquid introduces spherical aberration, which is minimized by using the least possible thickness of liquid and finding a liquid whose refractive index matches as closely as possible that of the lens element. In the deep-UV microlithography situation, the thickness of the liquid is chosen for other reasons, such as optical transmission, as well as liquid dynamics and mechanical considerations during wafer scanning and stepping. This design is not constrained by the choice of liquid thickness or refractive index. Currently, a liquid thickness of 1 mm is assumed, but the optical design may easily be re-optimized for a different thickness or liquid refractive index. Again this is facilitated by having a plane last lens surface next to the liquid, when the spherical aberration is constant across a large field size, and can be easily corrected at a pupil plane in the system by means of at least one aspheric surface.

Figure 5:
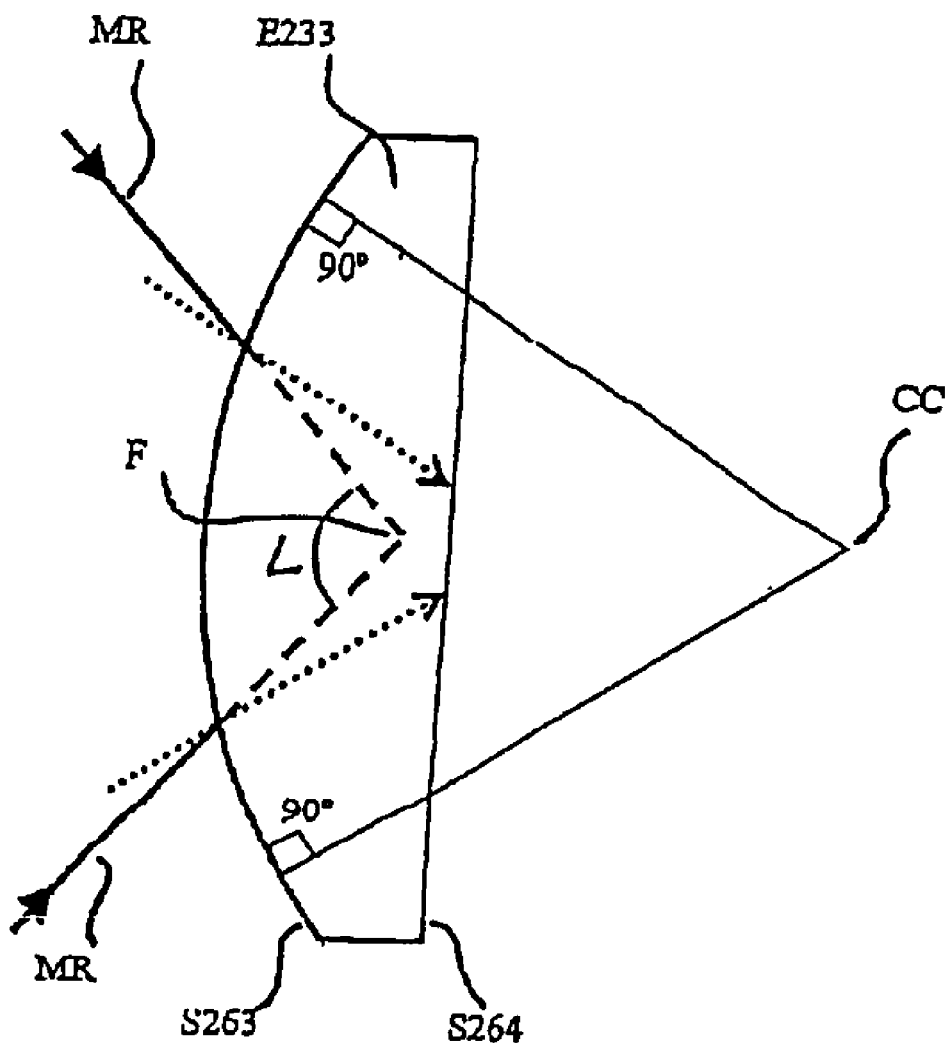
FIG. 5 shows an illustration of the marginal ray path passing into the last lens element according to the first embodiment of the present invention.
Figure 6:
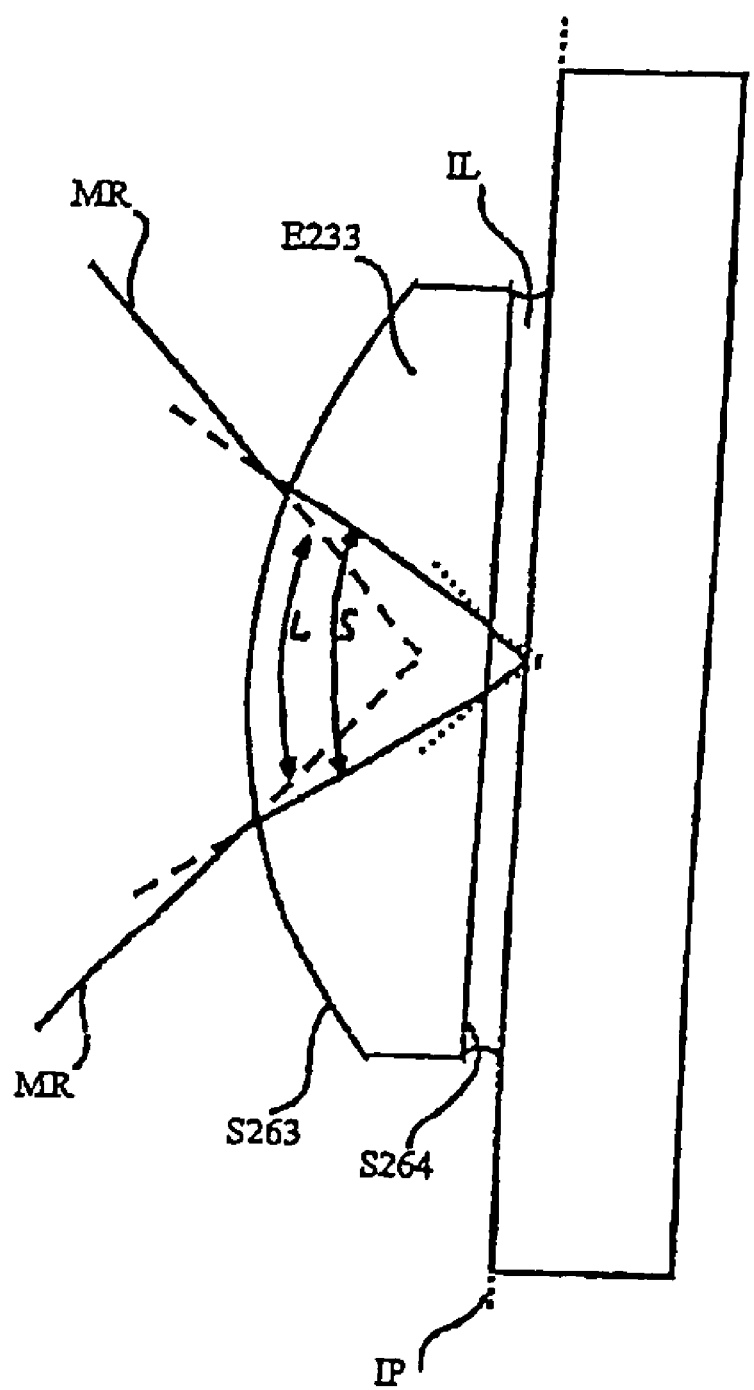
FIG. 6 shows an illustration of the marginal ray path passing through the last lens element into the immersion liquid layer according to the first embodiment of the present invention.

In this invention, neither the aplanatic nor concentric conditions are used in the last element, i.e., boundary lens, next to the wafer (surface S263 on element E233, FIGS. 2 and 4). In this case, the marginal ray convergence angle is slightly smaller inside element 233 than it was prior to entering it (as seen in FIGS. 5 and 6). This feature has three advantages:

a. The D/R (clear diameter/radius of curvature) of this surface can be constrained to be <1.5, which is within normal optical polishing techniques for large, high quality, optical elements.
b. The resulting spherical aberration and coma may easily be corrected in other elements in the system, including several aspherical surfaces, which is advantageous in the correction of high-order aberrations that change rapidly across the wide field used in microlithography, such as oblique spherical aberration, coma, astigmatism and distortion. This strategy is particularly effective in a long, complex system with two intermediate images, such as the V-type catadioptric design.
c. There is no focused ghost image on the wafer surface, as would occur with an exactly concentric surface.

Classical microscope objectives also employ at least one element before the last one that has a combination of aplanatic and concentric surfaces. The preferred embodiment of the invention employs, instead, at least two positive meniscus elements before the last one (elements E231 and E232 in FIGS. 2 and 3 and Tables 1 and 2) whose surfaces are neither exactly concentric nor aplanatic, so as to avoid both extreme curvatures and extreme angles of incidence near or beyond the critical angle.

At least one of these surfaces may be aspheric, so as to perform similar aberration correction functions to those which in lower NA "dry" designs may be achieved with air spaces between adjacent elements (e.g. the air space between elements E230 and E231 in FIG. 2).

The relatively high optical power in the last three positive elements minimizes the size increase of lens elements required in the rest of the system as the "dry" NA of 0.85 in designs such as FIG. 1 is increased to a "wet" NA of 1.2. This is very advantageous because the lenses would otherwise be larger than can be readily made with existing technology, and would thus be exceptionally expensive. The relatively high power of the last three elements also allows a pupil (aperture stop) position closer to the wafer than is typical in "dry" designs, e.g. FIG. 1.

A common feature of known catadioptric "dry" lithography projection systems is a negative powered element between the pupil and wafer. This feature, which is used to correct aberrations has the disadvantage that in a "wet" catadioptric optical projection system the main positive powered lenses would have to be larger than otherwise. The new arrangement in the present application has the advantage that it does not require such a negative powered lens and this further minimizes the lens diameter of the main positive powered lenses, and also the length of the optical path. The aberration correction of a negative lens element in "dry" designs (e.g. element L38 in FIG. 1) is performed, instead, by an aspheric surface close to the pupil.

The negative powered lens group, elements E222 to E225 in FIG. 2, is a double-Gauss anastigmat arranged to reduce spherical aberration. It contributes to field curvature and lateral color correction in the overall design, while minimizing higher-order coma and oblique spherical aberration that would otherwise be larger at NA 1.2 than they were in "dry" designs at NA 0.85 (FIG. 1). This feature provides the advantage of allowing a wider field of view than would otherwise be possible at NA 1.2.

As illustrated in FIGS. 5 and 6, it can be seen that the angle L of the marginal ray of the light cone projected to the boundary lens E233 decreases on passing into the boundary lens E233.

FIG. 5 and FIG. 6 illustrate one embodiment, where it can be seen that the geometric focus F of the marginal rays L, prior to entering the boundary lens E233, is located between the two optical surfaces S263 and S564 of the boundary lens, and is also between the centre of curvature CC of the boundary lens and the optical surface S263 of the boundary lens.

As also can be seen from FIG. 6, as the refractive index of the boundary lens E233 may typically not be equal to, and practically would be higher than, the refractive index of the layer of immersion liquid IL, the angle S of the marginal ray may increase on passing from the boundary lens E233 to the immersion liquid layer before impinging on the image plane IP.

It should be noted that the terms "object plane", "image plane", "pupil plane", and "plane mirror" are not limited to being plane surfaces, or plane mathematical surfaces, but may also be curved physical or mathematical surfaces. It should also be noted that the illustrations in FIGS. 1 to 6 are not to scale, and that the beam splitter E212, E218 may be a single element having two optical paths there through.

The aspheric surfaces A(1) to (A12) in Table 1 are defined by equation (3):

$$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20} \tag{3}$$

CURV is the inverse value of the apex radius of curvature, and the values CURV (or Curv), A, B, C, D, E, F, G, H, and J are tabulated in Table 2.

In Table 1, the sign of the radius indicates the direction of curvature, CC indicates a concave surface and CX indicates a convex surface. In the embodiment of table 1 the largest diameter of any of the lens elements E202 to E211, E213 to 217, E219 to E228 and E229 to E233 is only 242.8 mm for the positive lens element 227.

TABLE 1

| Element | Radius of Curvature Front | Radius of Curvature Back | Axial distance to next surface Front | Axial distance to next surface Back |
|---|---|---|---|---|
| E201 | Infinity | Infinity | 8.0000 | 1.0000 |
| E202 | 296.2214 CX | −960.8207 CX | 29.0933 | 1.0000 |
| E203 | 29.3195 CX | 219.1233 CC | 31.5402 | 69.4729 |
| E204 | 105.2542 CX | 433.274 A(1) | 30.2818 | 1.1583 |
| E205 | 77.5810 CX | 85.0063 CC | 35.9523 | 30.5076 |
| E206 | −101.0777 CC | −109.0575 CX | 50.0000 | 22.2382 |
| E207 | −86.9124 CC | −277.5585 CX | 17.0119 | 14.1315 |
| E208 | −313.0101 CC | −121.4285 CX | 47.1365 | 1.0000 |
| E209 | 244.5825 A(2) | −150.1716 CX | 43.8716 | 1.0000 |
| E210 | 287.8659 CX | −1006.7736 CX | 33.3703 | 3.9387 |
| E211 | 232.1539 CX | 3443.7633 A(3) | 26.1499 | 64.9981 |
| E212 | Infinity | | −248.6029 | |
| E213 | 99.3337 A(4) | 760.1855 CX | −12.5000 | −41.6713 |
| E214 | 112.9332 CC | 210.0532 CX | −12.5000 | −23.5805 |
| E215 | 150.9146 CC | | 23.5805 | |
| E216 | 210.0532 CX | 112.9332 CC | 12.5000 | 41.6713 |
| E217 | 760.1855 CX | 99.3337 A(5) | 12.5000 | 248.6029 |
| E218 | Infinity | | −64.0489 | |
| E219 | 3037.9516 CC | 252.1281 CX | −26.2012 | −1.0000 |
| E220 | −422.2688 CX | 878.8560 CX | −28.0789 | −1.0000 |
| E221 | −197.8858 CX | −1895.1173 CC | −36.9167 | −1.0000 |
| E222 | −134.6900 CX | 221.3134 A(6) | −46.1691 | −18.4179 |
| E223 | −1624.3296 CX | 89.3372 A(7) | −12.5000 | −44.5981 |
| E224 | 193.8597 CC | 211.4093 A(8) | −12.5000 | −14.8193 |
| E225 | −1550.8977 CX | 199.3485 CX | −32.2367 | −85.9268 |
| E226 | 1142.6351 A(9) | 305.6765 CX | −26.7479 | −1.0002 |
| E227 | −341.9216 CX | −5217.2118 CC | −30.8753 | −1.0000 |
| E228 | −274.1211 CX | 3414.1345 A(10) | −33.1045 | −9.8682 |

TABLE 1-continued

| Element | Radius of Curvature Front | | Radius of Curvature Back | | Axial distance to next surface Front | Axial distance to next surface Back |
|---|---|---|---|---|---|---|
| AS | Infinity | | | | 5.3722 | |
| E229 | −337.4484 | CX | −6051.4400 | CC | −40.2177 | −1.0007 |
| E230 | −286.9832 | CX | −47776.7480 | CC | −29.3234 | −1.0000 |
| E231 | −108.7000 | CX | 152.1155 | A(11) | −27.4984 | −1.0000 |
| E232 | −87.5448 | CX | 167.7647 | A(12) | −27.9141 | −1.0000 |
| E233 | −59.8643 | CX | Infinity | | −43.8105 | |
| IL | Infinity | | Infinity | | −1.0000 | |

TABLE 2

| Aspheric | Curv | K / E | A / F | B / G | C / H | D / J |
|---|---|---|---|---|---|---|
| A(1) | 0.00230801 | 0.000000 | 1.35800E−07 | 4.43804E−13 | 5.17522E−16 | −2.13416E−20 |
| | | 1.24264E−23 | 0.00000E+00 | 0.00000E+00 | 0.00000E+00 | 0.00000E+00 |
| A(2) | −0.00408861 | 0.000000 | −2.93564E−09 | 3.96730E−13 | −3.34166E−17 | −3.22241E−22 |
| | | 5.62462E−26 | −1.64835E−30 | 0.00000E+00 | 0.00000E+00 | 0.00000E+00 |
| A(3) | 0.00029038 | 0.000000 | 2.58600E−08 | −1.30225E−14 | −1.33600E−17 | 7.99491E−22 |
| | | −2.36540E−26 | 4.15511E−31 | 0.00000E+00 | 0.00000E+00 | 0.00000E+00 |
| A(4) | 0.01006708 | 0.000000 | −7.39601E−08 | −3.15605E−12 | −2.13807E−16 | −1.63643E−20 |
| | | −2.27561E−26 | −3.78485E−28 | 0.00000E+00 | 0.00000E+00 | 0.00000E+00 |
| A(5) | 0.01006708 | 0.000000 | −7.39601E−08 | −3.15605E−12 | −2.13807E−16 | −1.63643E−20 |
| | | −2.27561E−26 | −3.78485E−28 | 0.00000E+00 | 0.00000E+00 | 0.00000E+00 |
| A(6) | −0.00451848 | 0.000000 | 4.41668E−09 | −5.79647E−13 | −2.25277E−17 | 6.73716E−22 |
| | | −1.21801E−25 | −1.34613E−30 | 0.00000E+00 | 0.00000E+00 | 0.00000E+00 |
| A(7) | −0.01119354 | 0.000000 | −6.93411E−08 | −3.30971E−12 | −3.11788E−16 | −2.65850E−20 |
| | | −2.48878E−24 | −1.79947E−28 | 0.00000E+00 | 0.00000E+00 | 0.00000E+00 |
| A(8) | −0.00473016 | 0.000000 | −4.72629E−08 | 6.08755E−12 | −1.63469E−16 | −2.65475E−20 |
| | | 1.16802E−24 | −3.23662E−29 | 0.00000E+00 | 0.00000E+00 | 0.00000E+00 |
| A(9) | 0.00087517 | 0.000000 | 1.10141E−08 | −5.01692E−13 | −2.00493E−17 | −8.25872E−22 |
| | | 3.68761E−26 | 2.41555E−31 | 0.00000E+00 | 0.00000E+00 | 0.00000E+00 |
| A(10) | −0.00029290 | 0.000000 | −6.20015E−09 | −1.26050E−13 | −3.59314E−17 | 1.65781E−21 |
| | | −3.84229E−26 | 2.58938E−31 | 0.00000E+00 | 0.00000E+00 | 0.00000E+00 |
| A(11) | −0.00657395 | 0.000000 | 3.58357E−08 | −7.83628E−12 | 7.69481E−16 | −7.68364E−20 |
| | | 9.31381E−25 | 5.59854E−28 | 0.00000E+00 | 0.00000E+00 | 0.00000E+00 |
| A(12) | −0.0059607 | 0.000000 | −1.91466E−07 | 4.589321E−12 | 1.26164E−15 | 4.61975E−19 |
| | | −6.00362E−23 | −8.48073E−28 | 0.00000E+00 | 0.00000E+00 | 0.00000E+00 |

Figure 7:
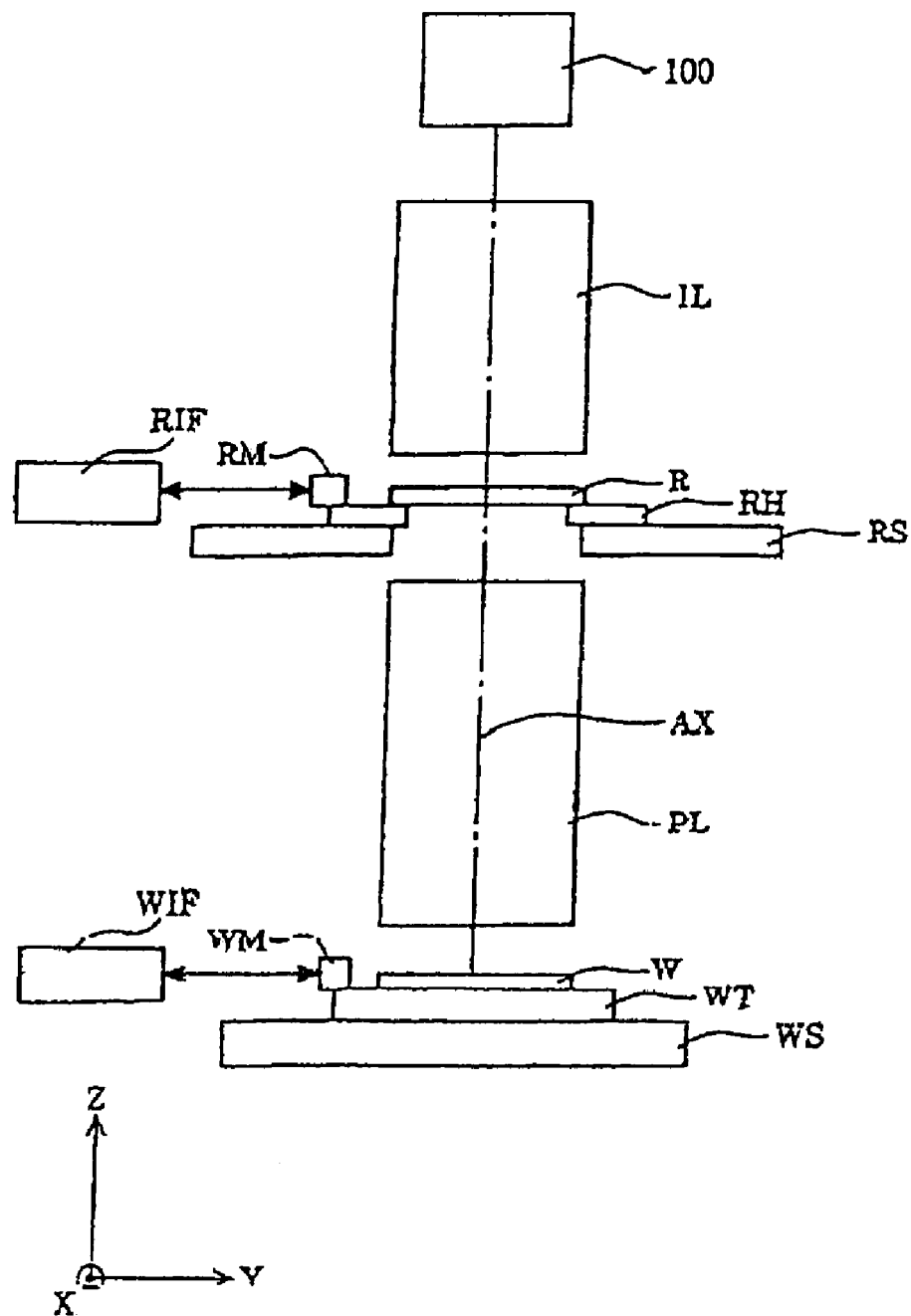
FIG. 7 schematically illustrates the configuration of exposure apparatus incorporating the present invention.

FIG. 7 schematically illustrates the configuration of an exposure apparatus incorporating the present invention. In FIG. 7, a Z-axis is set in parallel with a reference optical axis AX of a projection optical system PL; a Y-axis is set in parallel with the paper plane of FIG. 1, within a plane perpendicular to the reference axis AX; and an X-axis is set perpendicularly to the paper plane of FIG. 1.

The exposure apparatus shown in FIG. 7 has an ArF excimer laser source (oscillation center wavelength: 193.306 nm; used in the second and fourth embodiments) or an $F_2$ laser source (oscillation center wavelength: 157.631 nm; used in the third embodiment) as a light source 100 for supplying illuminating light of ultraviolet range. The light emitted from the light source 100 superposingly illuminates a reticle R having a prescribed pattern formed thereon via an illuminating optical system IL. An optical path between the light source 100 and the illuminating optical system IL is sealed with a casing (not shown), and the space from the light source 100 to an optical member the closest to the reticle in the illuminating optical system IL is substituted by an inert gas such as helium or nitrogen which is a gas having a low absorption rate of the exposure light, or kept in substantially a vacuum state.

The reticle R is held in parallel with an XY plane on the reticle stage via a reticle holder RH. A pattern to be transferred has been formed on the reticle R. A rectangular (slit-shaped) pattern area having a longer side in the X-direction in the entire pattern area and a shorter side in the Y-direction in the entire pattern area is illuminated. The reticle stage RS is two-dimensionally movable along the reticle surface (i.e., the X-Y plate) under the effect of a driving system not shown. The positional coordinates are measured by a interferometer RIF using a reticle moving mirror RM, and positionally controlled.

Light from the pattern formed on the reticle R forms a reticle pattern image on a wafer W serving as a photosensitive substrate via a projection optical system PL. The wafer W is held in parallel with the XY plane on the wafer stage WS via a wafer holder table WT. To correspond to the rectangular illuminating area on the reticle R, a pattern image is formed in the rectangular exposure area having a longer side in the X-direction and a shorter side in the Y-direction on the wafer W. The wafer stage WS is two-dimensionally movable along the wafer surface (i.e., the XY plane) under the effect of a driving system not shown. The positional coordinates thereof are measured by an interferometer WIF using a wafer moving mirror WM and positionally controlled.

Figure 8:
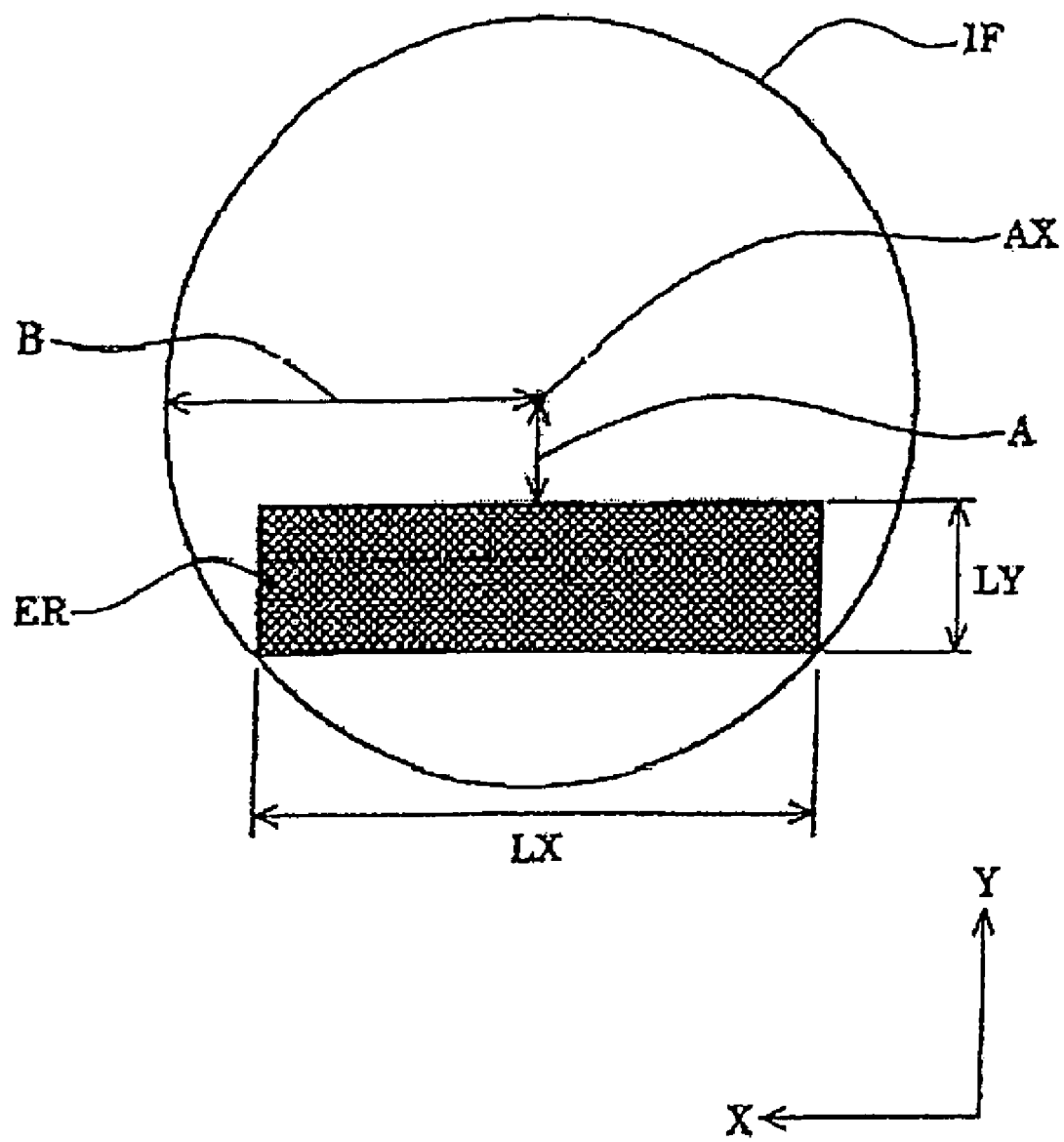
FIG. 8 illustrates the positional relationship between a rectangular effective exposure area formed on a wafer and a reference optical axis in second and third embodiments of the invention.

FIG. 8 illustrates the positional relationship between the rectangular effective exposure area formed on the wafer and the reference optical axis in second and third embodiments of the invention. In the second and third embodiments of the invention, as shown in FIG. 8, in a circular area (image circle) IF having a radius B around the reference optical axis AX as the center, the rectangular effective exposure area ER having a desired size is set at a position eccentric by A from the reference axis in the −Y direction. The effective exposure area ER has an X-direction length LX and a Y-direction length LY.

In other words, in the second and third embodiments, a rectangular effective exposure area ER having a desired size is set at a position apart by a off-axis amount A from the reference optical axis AX in the −Y direction, and the radius B of the circular image circle IF is regulated so as to comprehensively envelope the effective exposure area ER with the reference optical axis AX as the center. In response to this, on the reticle R, a rectangular illuminating area (i.e., effective illumination area) having a size and shape corresponding to the effective exposure area ER is formed at a position apart from the reference optical axis AX in the −Y direction by a distance corresponding to the off-axis amount A.

Figure 9:
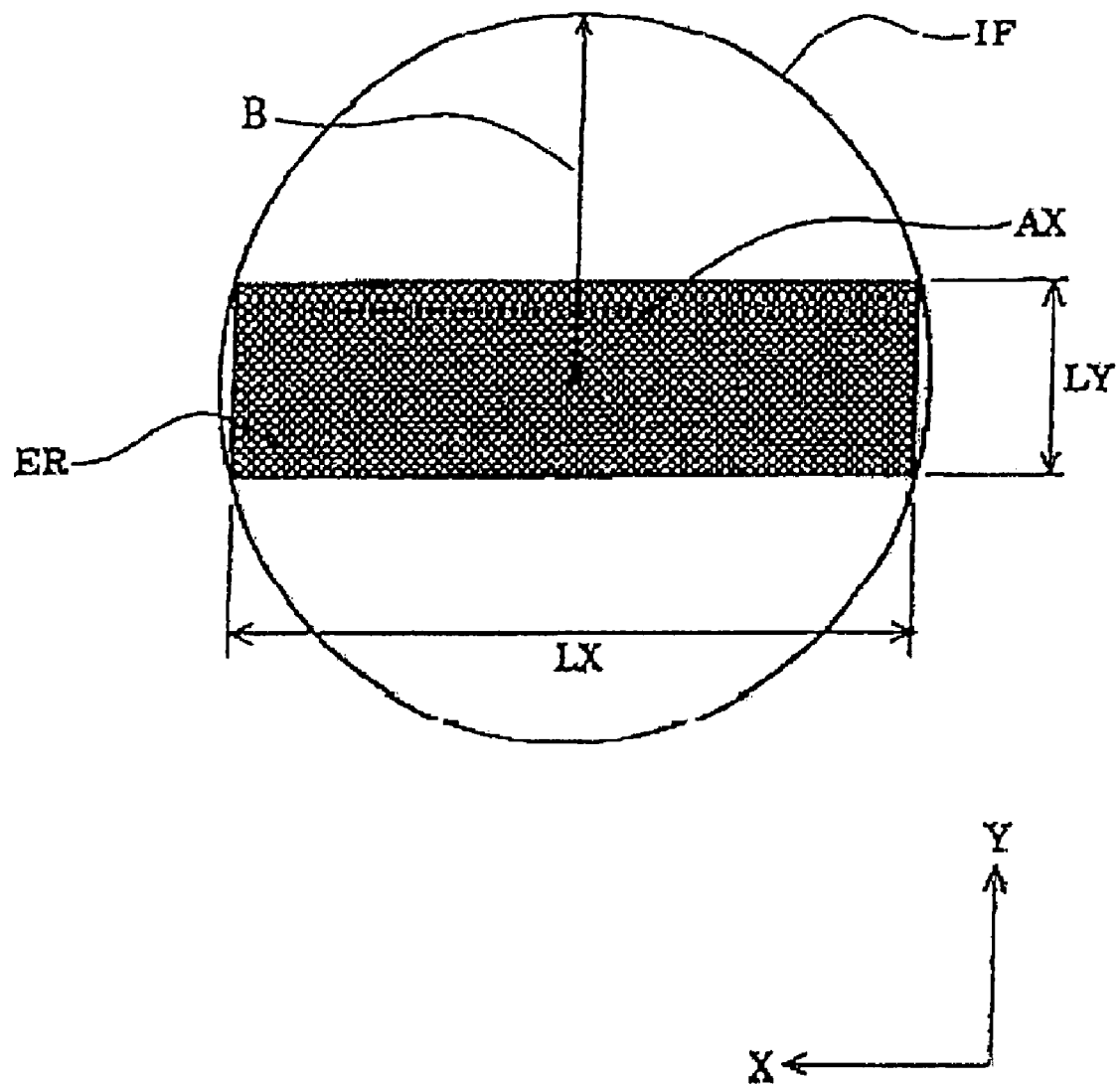
FIG. 9 illustrates the positional relationship between a rectangular effective exposure area formed on a wafer and a reference optical axis in a fourth embodiment.

FIG. 9 illustrates the positional relationship between the rectangular effective exposure area formed on a wafer and the reference optical axis in a fourth embodiment of the present invention. In the fourth embodiment of the invention, as shown in FIG. 9, in a circular area (image circle) IF having a radius B around the reference optical axis AX as the center, a rectangular effective exposure area ER extending in a long and thin shape in the X-direction is set with the reference optical axis as the center. The effective exposure area ER has an X-direction length LX and a Y-direction length LY. Although not shown, therefore, in response to this, a rectangular illuminating area having a size and shape corresponding to the effective exposure area ER around the reference optical axis AX as the center, is formed on the reticle R.

The exposure apparatus of this embodiment has a configuration in which, from among the optical members forming the projection optical system PL, the interior of the projection optical system PL is kept in an air-tight state between the optical member arranged at a position the closest to the reticle (in the fourth embodiment, the lens L11) and the boundary lens Lb arranged at a position the closest to the wafer W. The gas in the projection optical system PL is substituted by an inert gas such as helium gas or nitrogen or kept substantially in a vacuum state. The reticle R, the reticle stage RS and the like are arranged in a narrow optical path between the illuminating optical system IL and the projection optical system PL. The inert gas such as nitrogen or helium gas is filled in the interior of a casing (not shown) hermetically enclosing the reticle R, the reticle stage RS and the like, or the interior is maintained substantially in a vacuum state.

Figure 10:
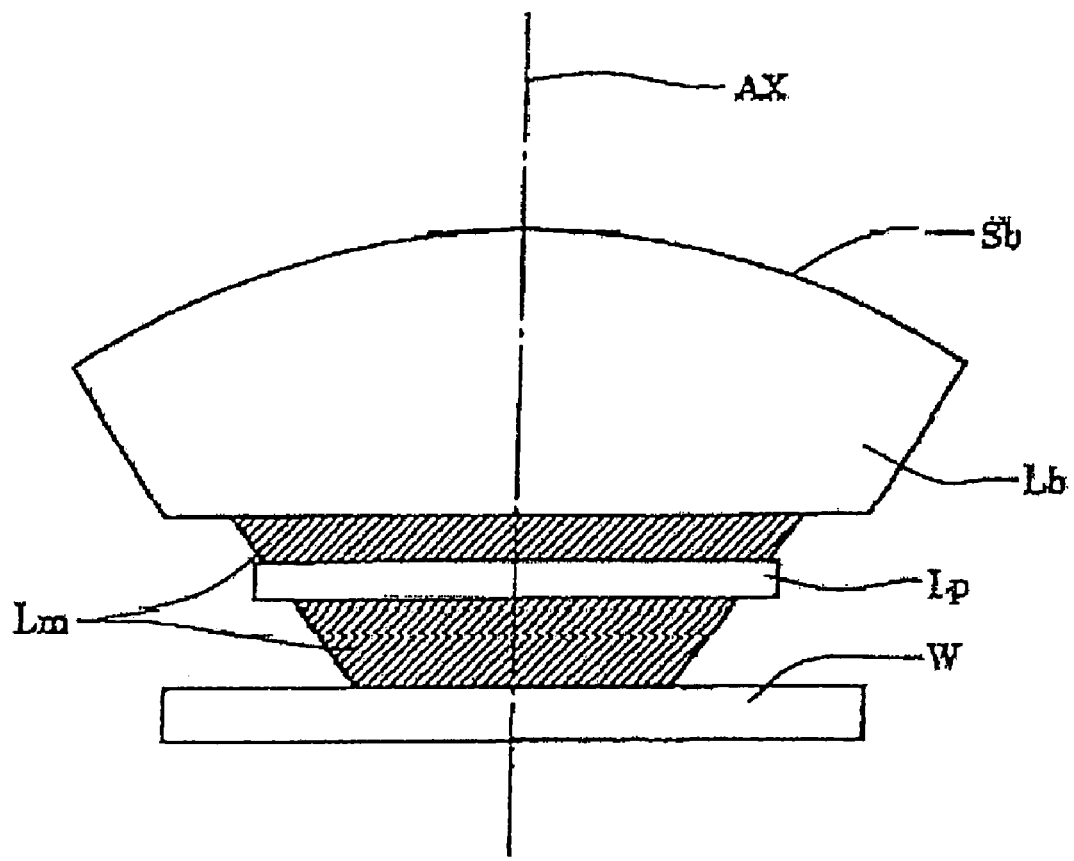
FIG. 10 schematically illustrates the configuration of a boundary lens and a wafer in the second to fourth embodiments.

FIG. 10 schematically illustrates the configuration between the boundary lens and the wafer in the embodiments. In the individual embodiments, the boundary lens Lb arranged at a position the closest to the wafer of the projection optical system PL has a convex surface toward the reticle (the first face). In other words, the face Sb of the boundary lens Lb on the reticle side has a positive refractive power. A parallel flat sheet Lp is detachably inserted in the optical path between the boundary lens Lb and the wafer W. The optical path between the boundary lens Lb and the optical path between the parallel flat sheet Lp and the wafer W are filled with a medium Lm having a refractive index larger than 1.1. As the medium Lm, the second and the fourth embodiments use deionized water, and the third embodiment uses a fluorine-based inert liquid such as Florinat.

In order to continue filling the optical path between the boundary lens Lb of the projection optical system PL and the wafer W with the liquid medium Lm during a period from beginning to end of scanning exposure in an exposure apparatus based on the step-and-scan process which accomplishes scanning and exposure while moving the wafer W relative to the projection optical system PL, for example, a technique disclosed in the above-mentioned International Publication No. WO99/49504 or a technique disclosed in Japanese Unexamined Patent Application Publication No. 10-303114 is applicable.

The technique disclosed in the International Publication No. WO99/49504 comprises the steps of filling an optical path between a boundary lens Lb and a wafer W with a liquid (medium Lm) of which the temperature is adjusted to a prescribed level from a liquid feeder via a supply pipe and a discharge nozzle, and collecting the liquid from the wafer W by means of the liquid feeder via a collecting pipe and an inlet nozzle. The amount of supplied liquid and the amount of collected liquid are adjusted in response to the moving speed of the wafer W relative to the projection optical system PL.

On the other hand, the technique disclosed in Japanese Unexamined Patent Application Publication No. 10-303114 comprises the steps of using a wafer holder table WT formed into a container so as to contain a liquid (medium Lm), and positioning and holding a wafer W by vacuum suction at the center of the inner bottom (in the liquid). A configuration is adopted so that the body tube tip of the projection optical system is immersed in the liquid and the optical face of the boundary lens Lb on the wafer side reaches the liquid level.

An atmosphere in which the exposure light is substantially unabsorbed is provided over the entire optical path from the light source 100 to the wafer W. As described above, the illumination area on the reticle R regulated by the projection optical system PL and the exposure area on the wafer W (i.e., the effective exposure area ER) are rectangular in shape having shorter sides running in the Y-direction. Therefore, a reticle pattern is scanned and exposed on an area having a width equal to the longer side of the exposure area and a length corresponding to the amount of scanning (amount of movement) of the wafer W on the wafer W by synchronously moving (scanning) the reticle stage RS and the wafer stage WS, i.e., the reticle R and the wafer W in the shorter-side direction of the rectangular exposure area and illumination area, while performing positional control of the reticle R and the wafer W by means of a driving system and an interferometer (RIF, WIF).

In the embodiments, the aspherical surface is expressed by the following equation (4) (which is equivalent to equation (3) using different notation) on the assumption of a height y in a direction perpendicular to the optical axis, a distance z (amount of sagging) in the optical axis direction between a contact plane at the apex of the asphere and a position on the asphere at the height y, an apex radius of curvature r, a conical coefficient κ, and an n-dimensional asphere coefficient Cn. In the embodiments, the lens surfaces formed into aspheric shape are marked with * to the right of the surface numbers.

$$z = (y^2/r)/\left[1 + \{1 - (1+\kappa)\cdot y^2/r^2\}^{1/2}\right] + C_4 \cdot y^4 + C_6 \cdot y^6 + C_8 \cdot y^8 + \quad (4)$$
$$C_{10}\cdot y^{10} + C_{12}\cdot y^{12} + C_{14}\cdot y^{14} + C_{16}\cdot y^{16} + C_{18}\cdot y^{18} + C_{20}\cdot y^{20}$$

Figure 11:
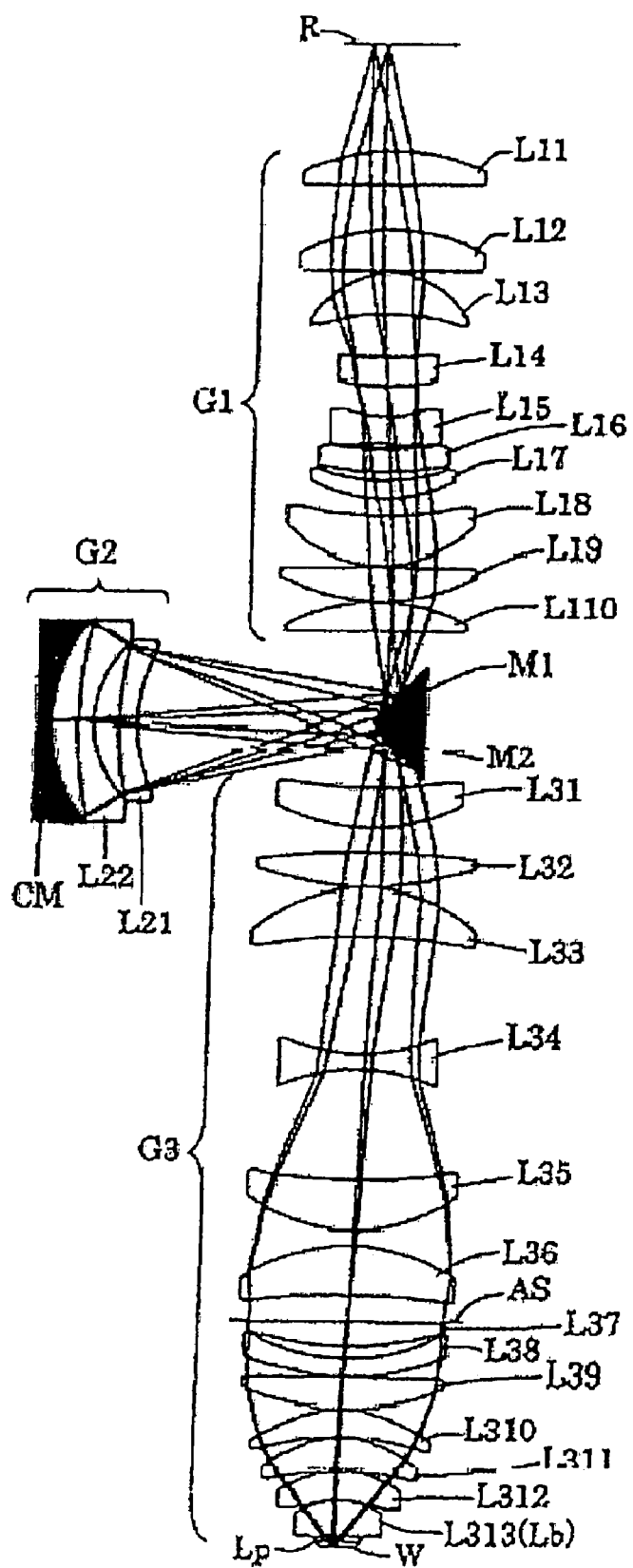
FIG. 11 illustrates the lens configuration of the projection optical system of the second embodiment of the invention.

FIG. 11 illustrates the lens configuration of the projection optical system of the second embodiment of the present invention. In the second embodiment, the projection optical system PL comprises a first image forming optical system G1 of the refraction type for forming a first intermediate image of the pattern of a reticle arranged on the object surface (plane 1), a second image forming optical system G2 for forming a second intermediate image (the first intermediate image which is a secondary image of the reticle pattern) including a concave reflector CM, and a third image forming optical system of the refraction type for forming a final image (a reduced image of the reticle pattern) of the reticle pattern on the wafer W arranged on the image field (plane 2) on the basis of the light from the second intermediate image.

A first optical path bending mirror M1 for deflecting the light from the first image forming optical system G1 toward the second image forming optical system G2 is arranged near the forming position of the first intermediate image in the optical path between the first image forming optical system G1 and the second image forming optical system G2. A second optical path bending mirror M2 for deflecting the light from the second image forming optical system G2 toward the third image forming optical system G3 is arranged near the forming position of the second intermediate image in the optical path between the second image forming optical system G2 and the third image forming optical system G3.

The first image forming optical system G1 has a linearly extending optical axis AX1. The third image forming optical system G3 has a linearly extending optical axis AX3. The optical axis AX1 and the optical axis AX3 are set so as to aligned with a reference optical axis AX which is a common single optical axis. The reference optical axis AX is positioned in the gravity direction (i.e., vertical direction). As a result, the reticle R and the wafer W are arranged in parallel with each other along a plane perpendicular to the gravity direction, i.e., along a horizontal plane. In addition, all the lenses forming the first image forming the first image forming optical system G1 and all the lenses forming the third image forming optical system G3 are arranged along the horizontal plane on the reference optical axis AX.

On the other hand, the second image forming optical system G2 also has an optical axis AX2 extending linearly, and this optical axis AX2 is set so as to be perpendicular to the reference optical axis AX. The first optical path bending mirror M1 and the second optical path bending mirror M2 have flat reflecting faces, and are integrally formed as a single optical member (a single optical path bending mirror) having two reflecting faces. The line of intersection of these two reflecting faces (strictly, the line of intersection of the virtual extension surfaces thereof) are set so as to cross AX1 of the first image forming optical system G1, AX2 of the second image forming optical system G2, and AX3 of the third image forming optical system G3 at one point.

In the second embodiment, an ArF excimer laser source is used as a light source 100. Quartz ($SiO_2$) is used for all the refracting optical members (lens components) forming the projection optical system PL and the parallel flat sheet Lp. The ArF excimer laser beam which is the exposure light has an oscillation center wavelength of 193.306 nm, and quartz has a refractive index of 1.5603261 for this center wavelength. Deionized water having a refractive index of 1.47 for the exposure light is used as the medium Lm present between the boundary lens Lb and the wafer W.

In the projection optical system PL in the second embodiment, the first image forming optical system G1 comprises, sequentially from the reticles side, a positive meniscus lens L11 with a convex face thereof directed toward the reticle; a biconvex lens L12 with an aspherical convex surface or face thereof directed toward the wafer; a positive meniscus lens L13 with a convex surface thereof directed toward the reticles; a positive meniscus lens L14 with a concave surface thereof directed toward the reticle; a negative meniscus lens L15 with a concave surface thereof directed toward the reticle; a positive meniscus lens L16 with a concave surface thereof directed toward the reticle; a positive meniscus lens L17 with an aspherical concave surface thereof directed toward the reticle; a positive meniscus lens L18 with a concave face thereof directed toward the reticle; a biconvex lens L19; and a positive meniscus lens L110 with an aspherical concave surface thereof directed toward the wafer.

The second image forming optical system G2 comprises, sequentially from the reticle side (i.e., from the incident side) along the forward running path of the light, a negative meniscus lens L21 with an aspherical concave surface thereof directed toward the reticle; a negative meniscus lens L22 with a concave surface thereof directed toward the reticle; and a concave reflector CM.

The third image forming optical system G3 comprises, sequentially from the reticle side in the running direction of the light, a positive meniscus lens L31 with a concave surface thereof directed toward the reticle; a biconvex lens L32; a positive meniscus lens L33 with an aspherical concave surface thereof directed toward the wafer; a biconvex lens L34; a positive meniscus lens L35 with an aspherical concave surface thereof directed toward the reticle; a positive meniscus lens L36 with an aspherical concave surface thereof directed toward the wafer; an aperture stop AS; a biconvex lens L37; a negative meniscus lens L38 with a concave surface thereof directed toward the reticle; a positive meniscus lens L310 with a convex surface thereof directed toward the reticle; a positive meniscus lens L311 with an aspherical concave surface thereof directed toward the wafer; a positive meniscus lens L312 with a convex face thereof directed toward the reticle; and a flat-convex lens L313 (a boundary lens Lb) with a flat surface thereof directed toward the wafer.

A parallel flat sheet Lp is arranged in the optical path between the flat-convex lens L313 serving as a boundary lens Lb and the wafer W. The optical path between the boundary lens Lb and the parallel flat sheet Lp, and the optical path between the parallel flat sheet Lp and the wafer W are filled with a medium Lm comprising deionized water.

The following Tables 3 and 4 show various parameters of the projection optical system PL of the second embodiment of FIG. 11. In Table 3, $\lambda$ represents a center wavelength of the exposure light; $\beta$, a projection magnification (an image forming magnification for all the systems); NA, a numerical aperture on the image side (wafer side); B, a radius of an image circle IF on the wafer W; A, an off-axis amount of the effective exposure area ER; LX, a size (longer side size) in the X-direction of the effective exposure area ER; and LY, a size (shorter side size) in the Y-direction of the effective exposure area ER.

The surface number represents the sequence from the reticle side in the light running direction from the reticle surface which is the object surface (plane 1) toward the wafer surface which is the image field (plane 2); r, curvature radii of the surfaces (in the case of an aspherical face, the apex curvature radii: in mm); d, the interval on the axis of the surfaces, i.e., the surface interval (mm); ED, the effective diameter (mm) of each surface; n, the refractive index relative to the center wavelength.

The surface interval d changes the sign every time reflection occurs. The sign of the surface interval is negative in the optical path from the reflecting surface of the first optical bending mirror M1 to the concave reflector CM and in the optical path extending from the reflecting surface of the second optical path bending mirror M2 to the image field. In the other optical paths, the sign is positive. For the first image forming optical system G1, the radius of curvature of the convex surface directed toward the reticle has a positive sign, and the radius of curvature of the concave surface has a negative sign. On the other hand, for the third image forming optical system G3, the radius of curvature toward the reticle has a positive sign, and the radius of curvature of the convex surface has a negative sign. For the second image forming optical system G2, the radius of curvature of the concave radius toward the reticle (i.e., on the incident side) has a positive sign, and the radius of curvature of the convex surface has a negative sign. The notation in Tables 3 and 4 is used also in the next Tables 5 and 6.

The following parameter values apply to Tables 3 and 4:
$\lambda$=193.306 nm
$\beta$=−¼
NA=1.0

D=B=15 mm
A=3 mm
LX=26 mm
LY=4.4 mm
Cb=0.01095 mm$^{-1}$
P=0 mm$^{-1}$
Cb·D/NA=0.164
|P·D|=0

TABLE 3

| Surface No. | r (mm) | d (mm) | n | |
|---|---|---|---|---|
| Reticle Surface | | 108.2689 | | |
| 501 | 244.17278 | 32.6883 | 1.5603261 | (L11) |
| 502 | 12431.0855 | 40.5868 | | |
| 503 | 218.00254 | 43.8864 | 1.5603261 | (L12) |
| 504* | −901.16882 | 1 | | |
| 505 | 95.35438 | 40.6221 | 1.5603261 | (L13) |
| 506 | 255.04609 | 43.5025 | | |
| 507 | −357.02117 | 25.9377 | 1.5603261 | (L14) |
| 508 | −305.85533 | 29.8146 | | |
| 510 | −2549.65778 | 4.178 | | |
| 511 | −591.66174 | 23.2188 | 1.5603261 | (L16) |
| 512 | −399.04534 | 8.7209 | | |
| 513* | −231.3931 | 20.2346 | 1.5603261 | (L17) |
| 514 | −148.33833 | 17.4652 | | |
| 515 | −354.63058 | 50 | 1.5603261 | (L18) |
| 516 | −136.53902 | 1 | | |

TABLE 3-continued

| Surface No. | r (mm) | d (mm) | n | |
|---|---|---|---|---|
| 534 | −1009.84284 | −33.6721 | 1.5603261 | (L32) |
| 535 | 345.39448 | −1 | | |
| 536 | −176.43124 | −49.9914 | 1.5603261 | (L33) |
| 537* | −663.25312 | −119.1058 | | |
| 538 | 205.20912 | −14.0042 | 1.5603261 | (L34) |
| 539 | −198.561 | −115.1819 | | |
| 540* | 1437.46317 | −49.9958 | 1.5603261 | (L35) |
| 541 | 188.22741 | −15.3421 | | |
| 542 | −212.79097 | −49.9776 | 1.5603261 | (L36) |
| 43* | −1223.58584 | −25.593 | | |
| 544 | ∞ | −1.0003 | | (AS) |
| 545 | −15481.75066 | −23.7099 | 1.5603261 | (L37) |
| 546 | 362.44209 | −12.9484 | | |
| 547 | 209.8877 | −14.0041 | 1.5603261 | (L38) |
| 548 | 345.03468 | −1.0007 | | |
| 549 | −11942.14877 | −29.1119 | 1.5603261 | (L39) |
| 550 | 278.1043 | −1 | | |
| 551 | −157.59127 | −26.2942 | 1.5603261 | (L310) |
| 552 | −333.08397 | −1 | | |
| 553 | −127.00506 | −33.438 | 1.5603261 | (L311) |
| 554* | −354.79236 | −1.0073 | | |
| 555 | −119.95893 | −27.9094 | 1.5603261 | (L312) |
| 556 | −139.80778 | −1 | | |
| 557 | −91.35661 | −34.5243 | 1.5603261 | (L313:Lb) |
| 558 | ∞ | −1 | 1.47 | (Lm) |
| 559 | ∞ | −4 | 1.5603261 | (Ln) |
| 560 | ∞ | −5 | 1.47 | (Lm) |
| Wafer surface | | | | |

TABLE 4

| Aspheric | κ<br>$C_{12}$ | $C_4$<br>$C_{14}$ | $C_6$ | $C_8$ | $C_{10}$ |
|---|---|---|---|---|---|
| 4 | 0<br>6.02784 × 10$^{−26}$ | 3.88992 × 10$^{−8}$<br>0 | −7.82619 × 10$^{−13}$ | 5.12223 × 10$^{−17}$ | −2.73274 × 10$^{−21}$ |
| 13 | 0<br>−1.04055 × 10$^{−24}$ | −6.25952 × 10$^{−8}$<br>3.26369 × 10$^{−29}$ | 5.48030 × 10$^{−13}$ | −3.31838 × 10$^{−16}$ | 1.38375 × 10$^{−20}$ |
| 20 | 0<br>−1.24577 × 10$^{−26}$ | 1.72798 × 10$^{−8}$<br>6.24349 × 10$^{−31}$ | −1.61452 × 10$^{−13}$ | −4.93244 × 10$^{−19}$ | 1.04591 × 10$^{−22}$ |
| 22 & 30 | 0<br>−5.01578 × 10$^{−25}$ | −8.82578 × 10$^{−8}$<br>2.58145 × 10$^{−29}$ | −2.18452 × 10$^{−12}$ | −8.66533 × 10$^{−17}$ | −3.62594 × 10$^{−21}$ |
| 37 | 0<br>4.71865 × 10$^{−28}$ | −7.06709 × 10$^{−9}$<br>−1.92011 × 10$^{−31}$ | 2.17699 × 10$^{−13}$ | 4.99998 × 10$^{−18}$ | 9.16340 × 10$^{−23}$ |
| 40 | 0<br>0 | 5.99640 × 10$^{−8}$<br>0 | −2.38721 × 10$^{−13}$ | −2.67049 × 10$^{−18}$ | 8.91192 × 10$^{−22}$ |
| 43 | 0<br>−2.95585 × 10$^{−26}$ | −1.17799 × 10$^{−8}$<br>0 | −5.24366 × 10$^{−13}$ | −2.67126 × 10$^{−17}$ | 1.52192 × 10$^{−21}$ |
| 54 | 0<br>−6.31540 × 10$^{−25}$ | −5.15363 × 10$^{−9}$<br>−1.49243 × 10$^{−29}$ | −2.43381 × 10$^{−12}$ | 6.03374 × 10$^{−17}$ | 2.56676 × 10$^{−21}$ |

TABLE 3-continued

| Surface No. | r (mm) | d (mm) | n | |
|---|---|---|---|---|
| 517 | 5811.09639 | 34.5332 | 1.5603261 | (L19) |
| 518 | −219.00801 | 1 | | |
| 519 | 208.57104 | 29.3963 | 1.5603261 | (L110) |
| 520* | 18419.59845 | 90.9569 | | |
| 521 | ∞ | −244.3047 | | (M1) |
| 522* | 131.03687 | −18.0014 | 1.5603261 | (L21) |
| 523 | 305.47877 | −26.1693 | | |
| 524 | 100.48802 | −16.0009 | 1.5603261 | (L22) |
| 525 | 385.87639 | −26.7822 | | |
| 526 | 149.24479 | 26.7822 | | (CM) |
| 527 | 385.87639 | 16.0009 | 1.5603261 | (L22) |
| 528 | 100.48802 | 26.1693 | | |
| 529 | 305 | 18.0014 | 1.5603261 | (L21) |
| 530* | 131.03687 | 244.3047 | | |
| 531 | ∞ | −64.0489 | | (M2) |
| 532 | 529.91109 | −39.4419 | 1.5603261 | (L31) |
| 533 | 219.30879 | −26.0915 | | |

Figure 12:
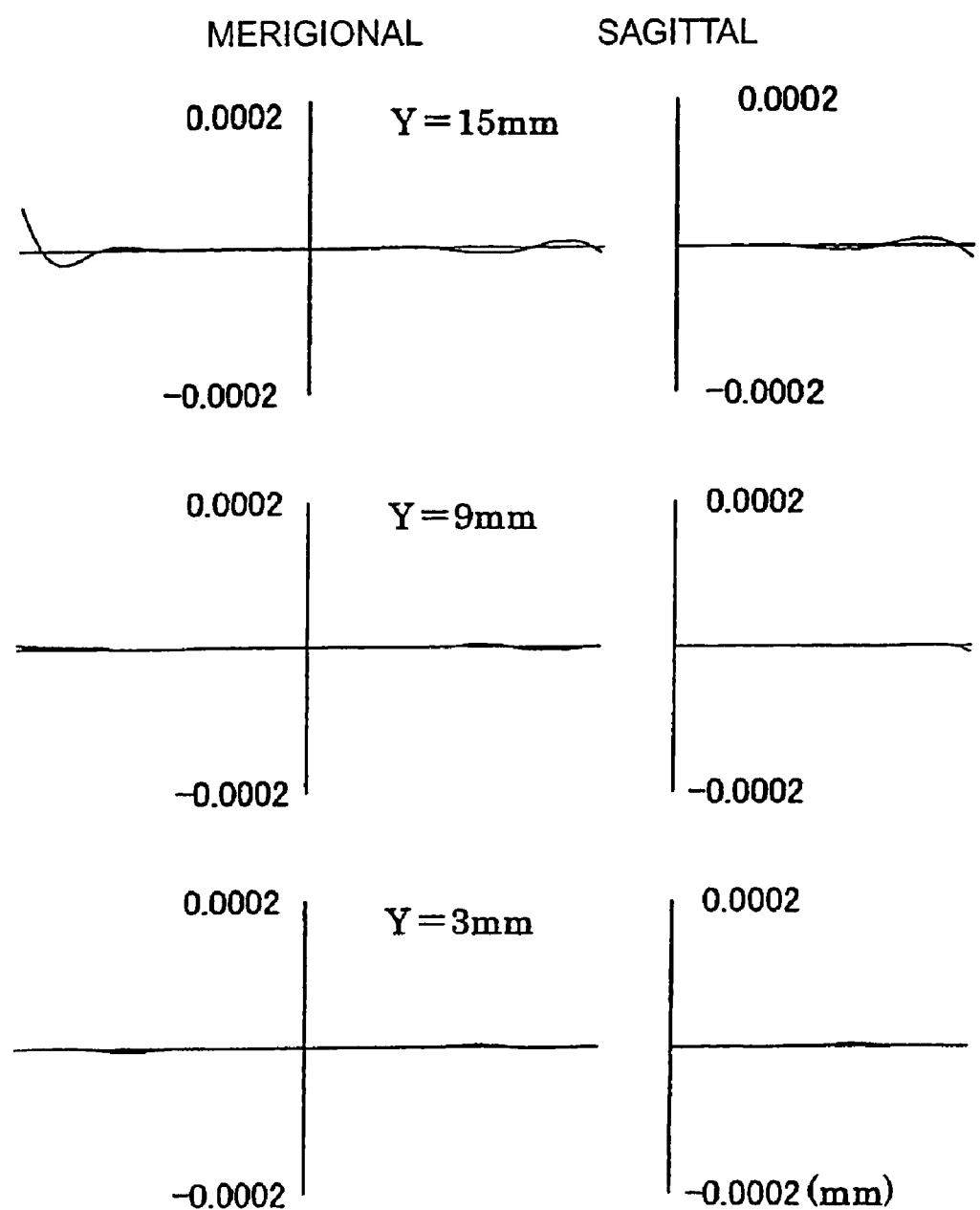
FIG. 12 illustrates lateral aberration in the second embodiment.

FIG. 12 illustrates lateral aberration. In the aberration diagram, Y represents the image height. The notation used in FIG. 12 applies also in the subsequent FIGS. 14 and 16. As is clear from the aberration diagram shown in FIG. 12, while, in the second embodiment, a very large image-side numerical aperture (NA=1.0) is ensured by using an ArF excimer laser beam, the aberration is satisfactorily corrected over the entire effective exposure area.

Figure 13:
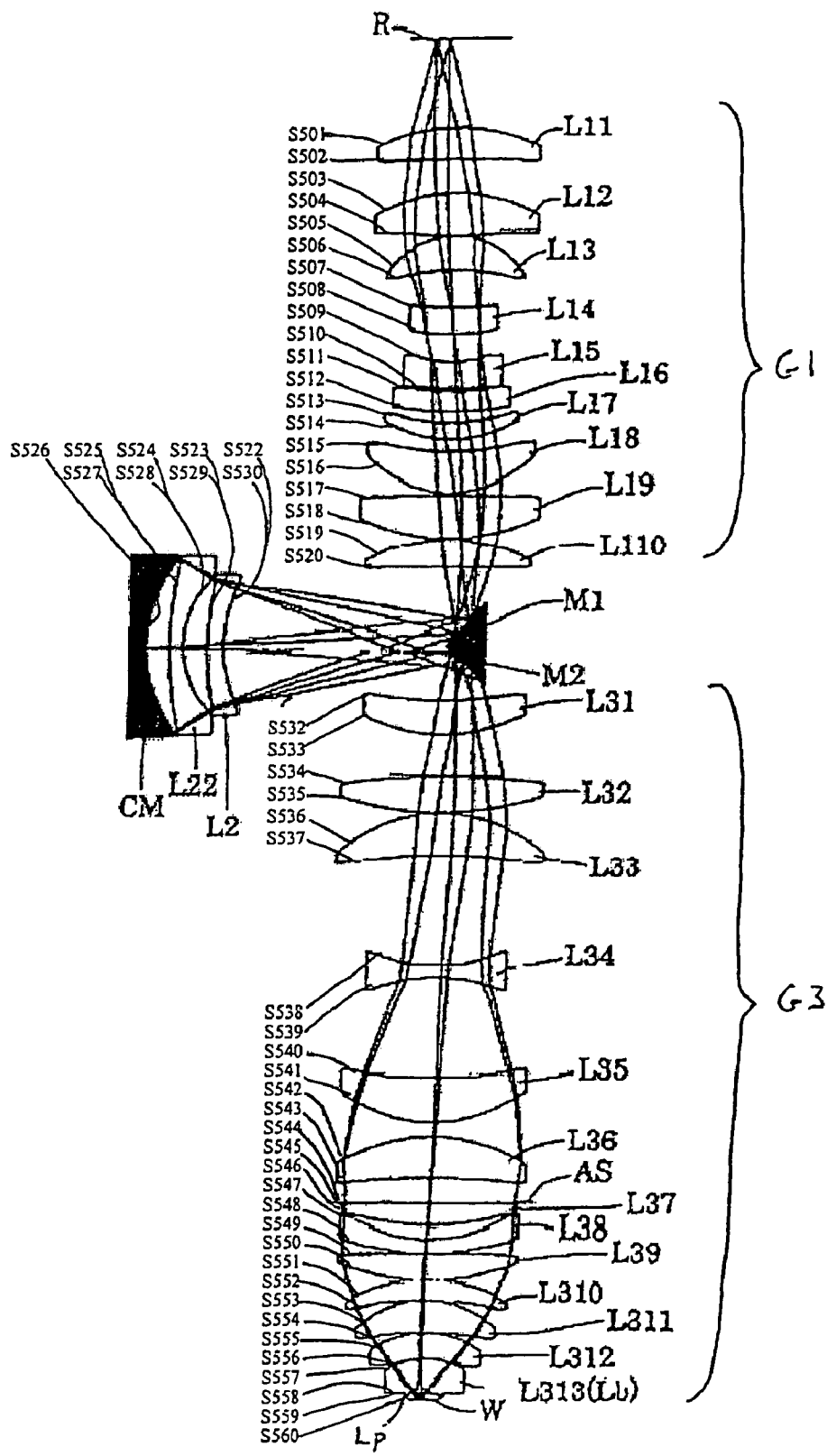
FIG. 13 illustrates the lens configuration of the projection optical system of the third embodiment of the invention.

FIG. 13 illustrates the lens configuration of the projection optical system of the third embodiment of the present invention. The projection optical system PL of the third embodiment is a reflection/refraction-type optical system having basically the same configuration as in the second embodiment. In the third embodiment, however, unlike the second embodiment, an $F_2$ laser source is used as the light source 100. Calcium fluoride ($CaF_2$) is employed for all the refractive optical members (lens components) forming the projection optical system PL and the parallel flat sheet Lp. $F_2$ laser beam serving as the exposure light has an oscillation center wavelength of 157.631 nm, and for this center wavelength, the calcium fluoride has a refractive index of 1.5592267. A fluorine-based inert liquid having a refractive index of 1.36 to the exposure light is used as the medium Lm between the boundary lens Lb and the wafer W.

In the projection optical system PL of the third embodiment, the first image forming optical system G1 comprises, sequentially from the reticle side, a positive meniscus lens L11 with a convex surface thereof directed toward the reticle; a biconvex lens L12 with an aspherical convex surface thereof directed toward the wafer; a positive meniscus lens L13 with a convex surface thereof directed toward the reticle; a positive meniscus lens L14 with a concave surface thereof directed toward the reticle; a negative meniscus lens 115 with a concave surface thereof directed toward the reticle; a negative meniscus lens L16 with a concave surface thereof directed toward the reticle; a positive meniscus lens L17 with an aspherical concave surface thereof directed toward the reticle; a positive meniscus lend L18 with a concave surface thereof directed toward the reticle; a biconvex lens L19; and a biconvex lens L110 with an aspherical surface thereof directed toward the wafer.

The second image forming optical system G2 comprises, sequentially from the reticle side (i.e., from the incident side) along the running path of light, a negative meniscus lens L21 with an aspherical concave surface thereof directed toward the reticle; a negative meniscus lens L22 with a concave surface thereof directed toward the reticle; and a concave reflector CM.

The third image forming optical system G3 comprises, sequentially from the reticle side along the running path of light, a positive meniscus lens L31 with a concave surface thereof directed toward the reticle; a biconvex lens L32; a positive meniscus lens L33 with an aspherical concave surface thereof directed toward the wafer; a biconvex lens L34; a positive meniscus lens L35 with an aspherical concave surface thereof directed toward the reticle; a positive meniscus lens L36 with an aspherical concave surface thereof directed toward the wafer; an aperture stop AS; a biconvex lens L37; a negative meniscus lens L38 with a concave surface thereof directed toward the reticle; a positive meniscus lens L310 with a convex surface thereof directed toward the reticle; a positive meniscus lens L311 with an aspherical concave surface thereof directed toward the wafer; a positive meniscus lens L312 with a convex surface thereof directed toward the reticle; and a flat convex lens L313 (boundary lens Lb) with a flat surface thereof directed toward the wafer.

A parallel flat sheet Lp is arranged in an optical path between the flat convex lens L313 serving as the boundary lens Lb and the wafer W. An optical path between the boundary lens Lb and the parallel flat sheet Lp and an optical path between the parallel flat sheet Lp and the wafer W are filled with a medium Lm comprising a fluorine-based inert liquid. In the third embodiment, in which a relatively large light quantity loss occurs upon passing through the medium Lm comprising the fluorine-based inert liquid, the distance between the parallel flat sheet Lp and the wafer W, i.e., the working distance, is set to a value considerably smaller than in the first embodiment. The following Tables 5 and 6 show various parameters of the projection optical system PL of the third embodiment. The following parameter values apply in Tables 5 and 6:

λ=157.631 nm
β=−¼
NA=1.0
D=B=15 mm
A=3 mm
LX=26 mm
LY=4.4 mm
Cb=0.01087 mm$^{-1}$
P=0 mm$^{-1}$
Cb·D/NA=0.163
|P·D|=0

TABLE 5

| Surface No. | r (mm) | d (mm) | n | |
|---|---|---|---|---|
| Reticle surface | | 101.913 | | |
| 501 | 225.91181 | 34.4965 | 1.5592267 | (L11) |
| 502 | 1436.06203 | 33.7438 | | |
| 503 | 201.91225 | 49.2729 | 1.5592267 | (L12) |
| 504* | −841.64457 | 1 | | |
| 505 | 96.6787 | 38.2983 | 1.5592267 | (L13) |
| 506 | 257.84523 | 43.1608 | | |
| 507 | −380.28084 | 27.546 | 1.5592267 | (L14) |
| 508 | −312.16425 | 30.1639 | | |
| 509 | −124.06734 | 28.9267 | 1.5592267 | (L15) |
| 510 | −557.96151 | 3.8304 | | |
| 511 | −366.97659 | 22.7734 | 1.5592267 | (L16) |
| 512 | −456.35163 | 12.9347 | | |
| 513* | −254.00244 | 19.0622 | 1.5592267 | (L17) |
| 514 | −156.7197 | 14.5386 | | |
| 515 | −336.79481 | 46.8839 | 1.5592267 | (L18) |
| 516 | −133.2981 | 2.8796 | | |
| 517 | 2442.55879 | 49.687 | 1.5592267 | (L19) |
| 518 | −237.47884 | 1.195 | | |
| 519 | 210.34651 | 30.7754 | 1.5592267 | (L110) |
| 520* | −18494.54411 | 86.6055 | | |
| 521 | ∞ | −256.5916 | | (M1) |
| 522* | 137.75129 | −18 | 1.5592267 | (L21) |
| 523 | 355.77715 | −27.9942 | | |
| 524 | 100.61796 | −16 | 1.5592267 | (L22) |
| 525 | 376.58992 | −26.125 | | |
| 526 | 150.70332 | 26.125 | | (CM) |
| 527 | 376.58992 | 16 | 1.5592267 | (L22) |
| 528 | 100.61796 | 27.9942 | | |
| 529 | 355.77715 | 18 | 1.5592267 | (L21) |
| 530* | 137.75129 | 256.5916 | | |
| 531 | ∞ | −64.0489 | | (M2) |
| 532 | 529.4817 | −37.2168 | 1.5592267 | (L31) |
| 533 | 217.84933 | −45.5764 | | |
| 534 | −906.17992 | −39.8472 | 1.5592267 | (L32) |
| 535 | 390.17706 | −1 | | |
| 536 | −175.866 | −49.6987 | 1.5592267 | (L33) |
| 537* | −666.25803 | −123.631 | | |
| 538 | 193.90829 | −14.451 | 1.5592267 | (L34) |
| 539 | −194.01757 | −115.5693 | | |
| 540* | 1756.45056 | −49.9992 | 1.5592267 | (L35) |
| 541 | 192.14442 | −16.6644 | | |
| 542 | −212.68601 | −46.8499 | 1.5592267 | (L36) |
| 543* | −1313.55988 | −26.5088 | | |
| 544 | ∞ | −1 | | (AS) |
| 545 | −46713.1214 | −22.7123 | 1.5592267 | (L37) |
| 546 | 380.61069 | −13.0721 | | |
| 547 | 213.48092 | −14.0147 | 1.5592267 | (L38) |
| 548 | 358.25443 | −1 | | |
| 549 | −3283.23016 | −29.4719 | 1.5592267 | (L39) |
| 550 | 287.34852 | −1 | | |
| 551 | −177.16315 | −23.5067 | 1.5592267 | (L310) |
| 552 | −351.98397 | −1 | | |
| 553 | −121.82696 | −35.6149 | 1.5592267 | (L311) |
| 554* | −392.8455 | −1 | | |
| 555 | −117.938 | −28.2524 | 1.5592267 | (L312) |
| 556 | −138.49028 | −1 | | |
| 557 | −91.96471 | −39.69 | 1.5592267 | (L313:Lb) |
| 558 | ∞ | −1 | 1.36 | (Lm) |
| 559 | ∞ | −4 | 1.5592267 | (Ln) |
| 560 | ∞ | −1 | 1.36 | (Lm) |
| Wafer surface | | | | |

TABLE 6

| Aspheric | κ | $C_4$ | $C_6$ | $C_8$ | $C_{10}$ | $C_{12}$ | $C_{14}$ |
|---|---|---|---|---|---|---|---|
| 4 | 0 | $-4.99618 \times 10^{-8}$ | $-7.39398 \times 10^{-13}$ | $6.16730 \times 10^{-17}$ | $-3.94177 \times 10^{-21}$ | $8.18197 \times 10^{-26}$ | 0 |
| 13 | 0 | $-6.25952 \times 10^{-8}$ | $1.42305 \times 10^{-12}$ | $-2.81530 \times 10^{-16}$ | $1.39566 \times 10^{-20}$ | $-5.93253 \times 10^{-25}$ | $1.35088 \times 10^{-29}$ |
| 20 | 0 | $1.68383 \times 10^{-8}$ | $-1.06688 \times 10^{-13}$ | $-2.92682 \times 10^{-18}$ | $2.12089 \times 10^{-22}$ | $-1.38926 \times 10^{-26}$ | $5.21818 \times 10^{-31}$ |
| 22 and 30 | 0 | $-8.30158 \times 10^{-8}$ | $-1.66607 \times 10^{-12}$ | $-6.51740 \times 10^{-17}$ | $-4.60984 \times 10^{-21}$ | $-7.40500 \times 10^{-26}$ | $-9.34635 \times 10^{-30}$ |
| 37 | 0 | $-5.68895 \times 10^{-9}$ | $2.19286 \times 10^{-13}$ | $5.12916 \times 10^{-18}$ | $6.51778 \times 10^{-23}$ | $-5.40821 \times 10^{-29}$ | $-2.41357 \times 10^{-31}$ |
| 40 | 0 | $5.94153 \times 10^{-8}$ | $-2.72431 \times 10^{-13}$ | $-3.72411 \times 10^{-18}$ | $8.85563 \times 10^{-22}$ | 0 | 0 |
| 43 | 0 | $-1.10623 \times 10^{-8}$ | $-5.34092 \times 10^{-13}$ | $-2.58209 \times 10^{-17}$ | $1.51679 \times 10^{-21}$ | $-3.00290 \times 10^{-26}$ | 0 |
| 54 | 0 | $-5.82309 \times 10^{-9}$ | $-2.25140 \times 10^{-12}$ | $6.80911 \times 10^{-17}$ | $3.12945 \times 10^{-21}$ | $-7.25627 \times 10^{-25}$ | $2.57401 \times 10^{-29}$ |

Figure 14:
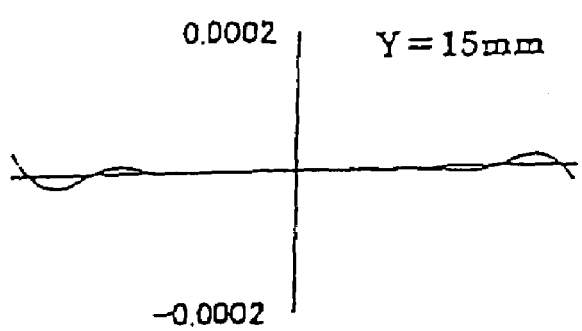
FIG. 14 illustrates the lateral aberration in the third embodiment of the invention.
Figure 14:
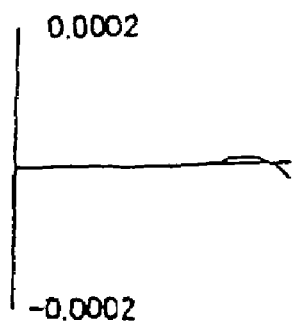
Figure 14:
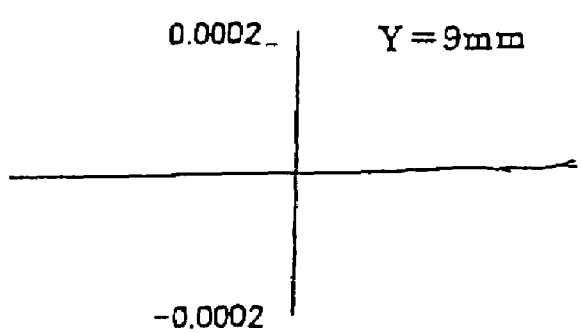
Figure 14:
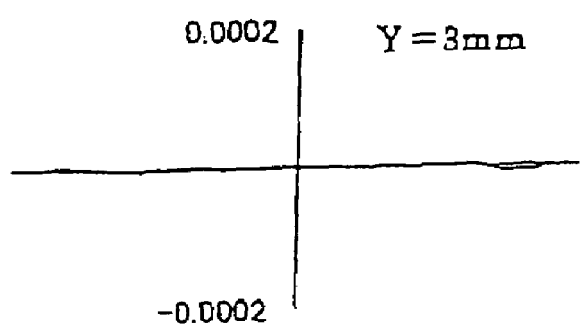

FIG. 14 illustrates the lateral aberration in the third embodiment. As is evident from the aberration diagram shown in FIG. 14, in the third embodiment, while a very large image-side numerical aperture (NA=1.0) is kept, the aberration is satisfactorily corrected over the entire effective exposure area.

Figure 15:
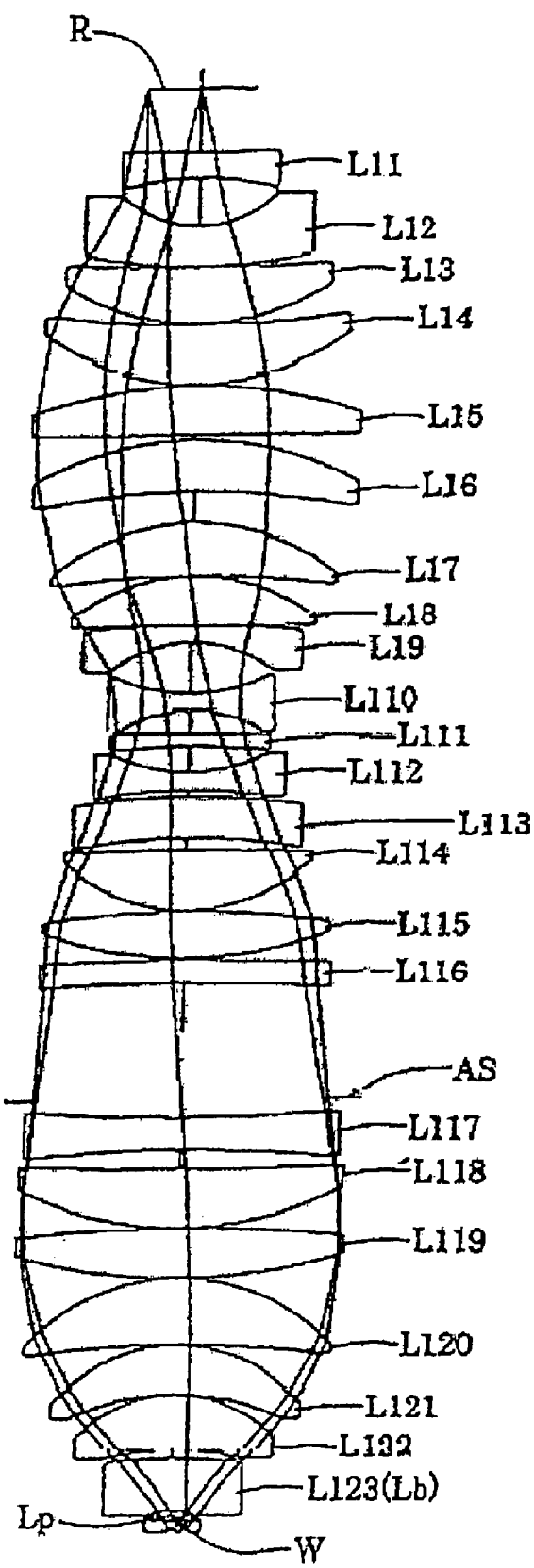
FIG. 15 illustrates the lens configuration of the projection optical system of the fourth embodiment of the invention.

FIG. 15 illustrates the lens configuration of the projection optical system of a fourth embodiment of the present invention. The projection optical system PL is a refraction-type optical system, unlike the first, second and third embodiments. However, in the fourth embodiment, as in the second embodiment, an ArF excimer laser source is used as the light source 100, and deionized water having a refractive index of 1.47 relative to the exposure light is used as the medium Lm provided between the boundary lens Lb and the wafer W.

In the fourth embodiment, quartz ($SiO_2$) or calcium fluoride ($CaF_2$) is used for the refractive optical member (a lens component) and the parallel flat sheet Lp forming the projection optical system PL. More specifically, lenses L13, L17, L18, L114, L115, L122 and L123 (Lb) are formed from calcium fluoride, and the other lenses and the parallel flat sheet Lp are formed from quartz. The ArF excimer laser beam serving as the exposure light has an oscillation center wavelength of 193.306 nm. Quartz has a refractive index of 1.5603261 for this center wavelength, and calcium fluoride has a refractive index of 1.5014548.

The projection optical system PL of the fourth embodiment comprises, sequentially from the reticle side, a biconcave lens L11 with an aspherical concave surface thereof directed toward the wafer; a negative meniscus lens L12 with a concave surface thereof directed toward the reticle; a positive meniscus lens L13 with a concave surface thereof directed toward the reticle; a positive meniscus lens L14 with an aspherical concave surface thereof directed toward the reticle; a positive meniscus lens L16 with a convex surface thereof directed toward the reticle; a positive meniscus lens L17 with a convex surface thereof directed toward the reticle; a positive meniscus lens L18 with a convex surface thereof directed toward the reticle; a negative meniscus lens L19 with a convex surface thereof directed toward the reticle; a biconcave lens L110 with an aspherical concave surface thereof directed toward the reticle; a biconcave lens L111 with an aspherical concave surface thereof directed toward the wafer; a biconcave lens L112 with an aspherical concave surface thereof directed toward the wafer; a positive meniscus lens L113 with an aspherical concave surface thereof directed toward the wafer; a biconvex lens L114; a biconvex lens L115; a negative meniscus lens L116 with a convex surface thereof directed toward the reticle; an aperture stop AS; a biconcave lens L117; a positive meniscus lens L118 with a concave surface thereof directed toward the reticle; a biconvex lens L119; a positive meniscus lens L120 with a convex surface thereof directed toward the reticle; a positive meniscus lens L121 with an aspherical concave surface thereof directed toward the wafer; a positive meniscus lens L122 with a convex surface thereof directed toward the reticle; and a negative meniscus lens L123 (boundary lens Lb) with a convex surface thereof directed toward the reticle.

A parallel flat sheet Lp is arranged in an optical path between the negative meniscus lens L123 serving as a boundary lens Lb and the wafer W. An optical path between the boundary lens Lb and the parallel flat sheet Lp and an optical path between the parallel flat sheet Lp and the wafer W are filled with a medium Lm comprising deionized water.

The following Tables 7 and 8 show parameters of the projection optical system PL of the fourth embodiment. In Table 7 and 8, λ represents the center wavelength of the exposure light; β, a projection magnification (image forming magnification for the entire system); NA, the numerical aperture on the image side (wafer side); B, the radius of an image circle on the wafer W; LX, the size (the size of the longer side) of the effective exposure area ER in the X-direction; and LY, the size (the size of the shorter side) of the effective exposure area ER in the Y-direction.

The surface number represents the sequence of a surface from the reticle side in the light running direction from the reticle surface which is the object surface (surface 1) to the wafer surface which is the image field (surface 2); r represents the radius of curvature of each surface (apex radius of curvature in the case of an aspherical surface: in mm); d, the interval on the axis of each surface, i.e., the surface interval (mn); ED, the effective diameter (mm) of each surface; and n, the refractive index for a center wavelength. It is assumed that the radius of curvature of a convex surface directed toward the reticle is positive, and a concave surface has a negative radius of curvature. The following parameter values apply in Tables 7 and 8:

λ=193.306 nm
β=−¼
NA=0.9
D=B=12 mm
LX=22 mm

LY=9 mm
Cb=0.002 mm$^{-1}$
P=0 mm$^{-1}$
Cb·D/NA=0.0267
|P·D|=0

TABLE 7

| Surface No. | r (mm) | d (mm) | n | |
|---|---|---|---|---|
| | (Reticle face) | 55.8515 | | |
| 501 | −2113.36467 | 22.0016 | 1.5603261 | (L11) |
| 502* | 216.83131 | 37.6588 | | |
| 503 | −99 | 35.9329 | 1.5603261 | (L12) |
| 504 | −530.65397 | 1 | | |
| 505 | −2085.24301 | 49.6884 | 1.5014548 | (L13) |
| 506 | −211.94203 | 1 | | |
| 507* | −1300.49159 | 51 | 1.5603261 | (L14) |
| 508 | −228.7234 | 1 | | |
| 509 | 449.54298 | 42.9915 | 1.5603261 | (L15) |
| 510 | −31743139.73 | 4.4564 | | |
| 511 | 286.16093 | 46.424 | 1.5603261 | (L16) |
| 512 | 700 | 27.3629 | | |
| 514 | 835.17809 | 1 | | |

TABLE 7-continued

| Surface No. | r (mm) | d (mm) | n | |
|---|---|---|---|---|
| 540 | 186 | 57.7875 | 1.5603261 | (L120) |
| 541 | 997.61736 | 1 | | |
| 542 | 158.43716 | 36.3731 | 1.5603261 | (L121) |
| 543* | 202.36197 | 1 | | |
| 544 | 120 | 48.8077 | 1.5014548 | (L122) |
| 545 | 244.45698 | 7.8937 | | |
| 546 | 500 | 45.5175 | 1.5014548 | (L123:Lb) |
| 547 | 100.78932 | 4.5 | 1.47 | (Lm) |
| 548 | ∞ | 4 | 1.5603261 | (Lp) |
| 549 | ∞ | 9 | 1.47 | (Lm) |
| 550 | | | | |
| 551 | −177.16315 | −23.5067 | 1.5592267 | (L310) |
| 552 | −351.98397 | −1 | | |
| 553 | −121.82696 | −35.6149 | 1.5592267 | (L311) |
| 554* | −392.8455 | −1 | | |
| 555 | −117.938 | −28.2524 | 1.5592267 | (L312) |
| 556 | −138.49028 | −1 | | |
| 557 | −91.96471 | −39.69 | 1.5592267 | (L313:Lb) |
| 558 | ∞ | −1 | 1.36 | (Lm) |
| 559 | ∞ | −4 | 1.5592267 | (Ln) |
| 560 | ∞ | −1 | 1.36 | (Lm) |
| Wafer | | | | |

TABLE 8

| Aspheric | κ<br>$C_{12}$ | $C_4$<br>$C_{14}$ | $C_6$ | $C_8$ | $C_{10}$ |
|---|---|---|---|---|---|
| 2 | 0<br>−2.03062 × 10$^{-24}$ | −1.49703 × 10$^{-7}$<br>5.69043 × 10$^{-29}$ | 6.71854 × 10$^{-12}$ | −3.64562 × 10$^{-16}$ | 4.13593 × 10$^{-20}$ |
| 7 | 0<br>1.74725 × 10$^{-28}$ | −1.18880 × 10$^{-8}$<br>−4.32881 × 10$^{-32}$ | 1.02901 × 10$^{-13}$ | −7.54528 × 10$^{-19}$ | 5.83141 × 10$^{-23}$ |
| 19 | 0<br>3.26842 × 10$^{-24}$ | −7.74045 × 10$^{-8}$<br>−3.56309 × 10$^{-28}$ | 1.56057 × 10$^{-11}$ | −1.10312 × 10$^{-15}$ | 3.62488 × 10$^{-20}$ |
| 22 | 0<br>−4.51996 × 10$^{-24}$ | −1.04821 × 10$^{-7}$<br>4.81943 × 10$^{-28}$ | 8.80831 × 10$^{-12}$ | 3.69747 × 10$^{-17}$ | −2.96855 × 10$^{-20}$ |
| 24 | 0<br>−8.61747 × 10$^{-25}$ | 1.27905 × 10$^{-8}$<br>−7.01397 × 10$^{-29}$ | 7.05643 × 10$^{-13}$ | −4.87282 × 10$^{-16}$ | 4.68907 × 10$^{-20}$ |
| 26 | 0<br>−4.70258 × 10$^{-25}$ | 7.26173 × 10$^{-8}$<br>1.17373 × 10$^{-29}$ | −3.04123 × 10$^{-12}$ | −2.32724 × 10$^{-17}$ | 8.20189 × 10$^{-21}$ |
| 43 | 0<br>3.04007 × 10$^{-27}$ | −1.90186 × 10$^{-8}$<br>4.59309 × 10$^{-31}$ | −8.61256 × 10$^{-14}$ | 1.45348 × 10$^{-17}$ | 4.84634 × 10$^{-24}$ |

TABLE 7-continued

| Surface No. | r (mm) | d (mm) | n | |
|---|---|---|---|---|
| 515 | 176.47058 | 44.0153 | 1.5014548 | (L18) |
| 516 | 4997.43477 | 1 | | |
| 517 | 1190.04003 | 14.0931 | 1.5603261 | (L19) |
| 518 | 117.90394 | 42.896 | | |
| 519* | −174.99987 | 14 | 1.5603261 | (L110) |
| 520 | 122.55049 | 22.0064 | | |
| 521 | −9702.06368 | 10 | 1.5603261 | (L111) |
| 522* | 501.0497 | 22.5348 | | |
| 523 | −150 | 15.2478 | 1.5603261 | (L112) |
| 524* | 545.44066 | 5.0208 | | |
| 525 | 670.66815 | 37.0463 | 1.5603261 | (L113) |
| 526* | 1258.71661 | 9.9406 | | |
| 527 | 5070.2394 | 51.1959 | 1.5014548 | (L114) |
| 528 | −161.64547 | 1 | | |
| 529 | 827.78244 | 41.9662 | 1.5014548 | (L115) |
| 530 | −354.18335 | 2.2506 | | |
| 531 | 4796.10166 | 21.3348 | 1.5603261 | (L116) |
| 532 | 2003.44485 | 100.6473 | | |
| 534 | ∞ | 19.4869 | | (AS) |
| 534 | −1507.37025 | 26.9184 | 1.5603261 | (L117) |
| 535 | 1249.53353 | 17.3121 | | |
| 536 | −3874.77086 | 48.5508 | 1.5603261 | (L118) |
| 537 | −333.94853 | 1 | | |
| 538 | 1503.93894 | 41.7658 | 1.5603261 | (L119) |
| 539 | −563.59244 | 1 | | |

Figure 16:
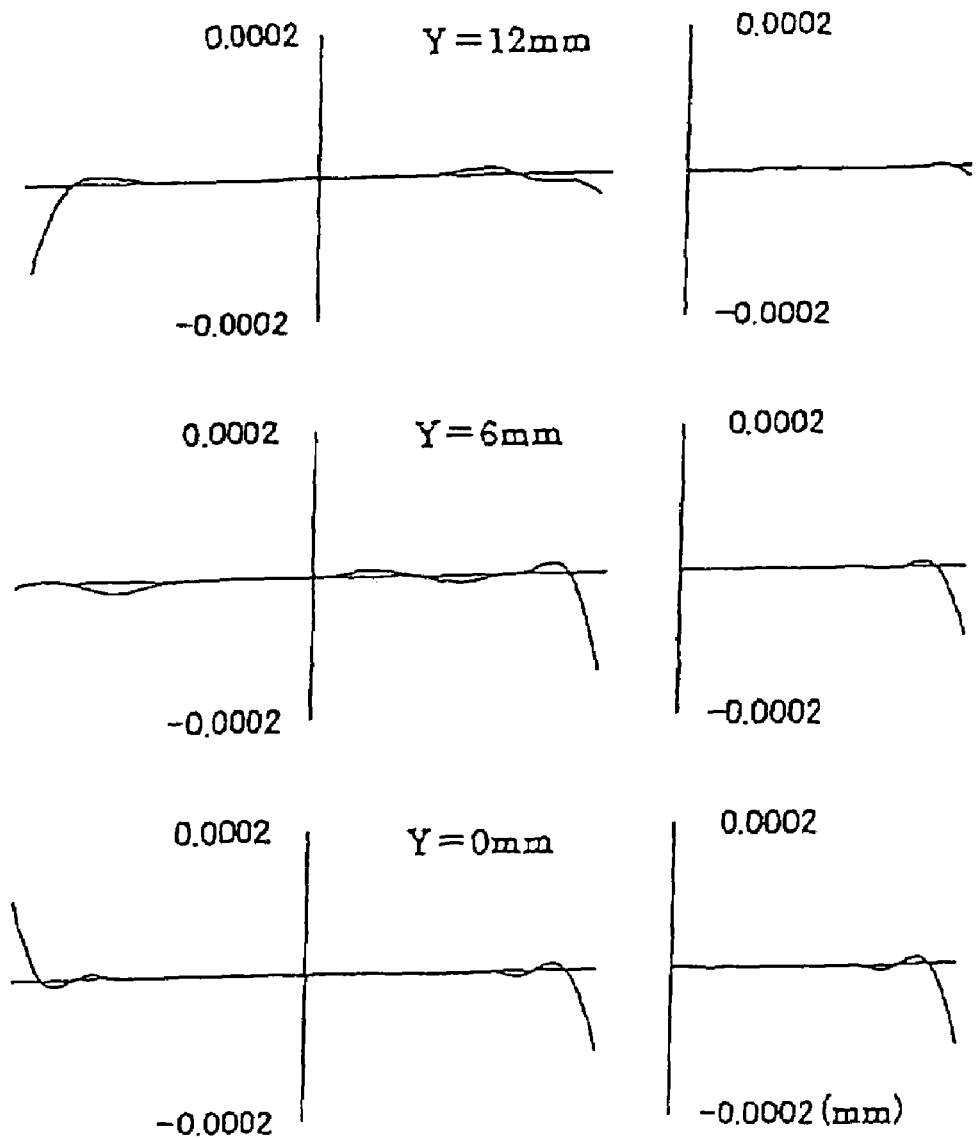
FIG. 16 illustrates the lateral aberration in the fourth embodiment.

FIG. 16 illustrates a lateral aberration in the fourth embodiment. As is clear from the aberration diagram shown in FIG. 16, in the fourth embodiment, while a relatively large image-side numerical aperture (NA=0.9) is maintained by using an ArF excimer laser beam in the refraction-type projection optical system, the aberration is satisfactorily corrected over the entire effective exposure area.

Thus, in the second embodiment, it is possible to ensure a high image-side numerical aperture of 1.0 for the ArF excimer laser beam having a wavelength of 193.306 nm and maintain a rectangular effective exposure area (stationary exposure area) having a size of 26 mm×4.4 mm as an area in which various aberrations are sufficiently corrected within an image circle having a radius of 15 mm on the wafer W. For example, a circuit pattern can be scanned and exposed at a high resolution within a 26 mm×33 mm rectangular exposure area.

In the third embodiment, it is possible to ensure a high image-side numerical aperture of 1.0 for the $F_2$ laser beam having a wavelength of 157.631 nm and maintain a rectangular effective exposure area (stationary exposure area) having a size of 26 mm×4.4 mm as an area in which various aberrations are sufficiently corrected within an image circle having a radius of 15 mm on the wafer W. For example, a circuit pattern can be scanned and exposed at a high resolution within a 26 mm×33 mm rectangular exposure area.

In the fourth embodiment, it is possible to ensure a high image-side numerical aperture of 0.9 for the ArF excimer laser beam having a wavelength of 193.306 nm and maintain a rectangular effective exposure area (stationary exposure area) having a size of 22 mm×9 mm as an area in which various aberrations are sufficiently corrected within an image circle having a radius of 12 mm on the wafer W. For example, a circuit pattern can be scanned and exposed at a high resolution within a 22 mm×33 mm rectangular exposure area.

While, in the second embodiment, all the lens components are made of quartz, the risk of deterioration of the image forming function caused by the compaction of quartz can be avoided by forming small-diameter lenses from calcium fluoride, on which the energy of exposure light concentrates (such as the boundary lens Lb arranged near the wafer W or the lens L312).

If it is preferable to limit the condition relating to the magnification of the third imaging lens group, the conditional expression can be limited as follows:

$$0.75 < MA/MG3 < 1.1 \quad (5)$$

preferably 0.8<MA/MG3<1.05 where MA denotes a magnification of the whole optical system, and MG3 denotes a magnification of the third imaging lens system G3.

When a numerical aperture NA for light entering to the plane mirror having the role of separating optical paths becomes large, it becomes difficult to separate optical paths, so that it becomes necessary that the distance between the optical axis and the exposure area is made to be large. In order to secure sufficient exposure area, it is inevitable that the optical system becomes large. Even if a large numerical aperture NA is expected on the image side, by satisfying a conditional expression regarding the magnification of the third imaging lens group, the increase in numerical aperture on entering the plane mirror is gentle, so that optical path separation can be made easier. Accordingly, a large numerical aperture NA on the image side is secured and good optical performance can be obtained without causing the optical system to become large.

In order to make the numerical aperture NA large and to prevent the diameter of lenses locating in the vicinity of the aperture stop getting larger, it is necessary to shorten the distance between the aperture stop and the image plane (second plane) as well as to increase the composite positive refractive power of the focusing lens group arranged between the aperture stop and the image plane. At the same time, in order to prevent lens deformation caused by holding a lens element, it is necessary to secure sufficient edge thickness of a lens, so that it is preferable that the focusing lens group is composed of five lens elements or less. Moreover, in order to increase positive refractive power effectively, it is preferable that the focusing lens group does not include a negative lens element.

For reference purposes, the following summarises the overall magnification MA and the magnification MG3, of the third stage G3 in various embodiments.

|  | Magnification | | |
| --- | --- | --- | --- |
|  | MA | MG3 | MA/MG3 |
| 1st Embodiment | 1/4 | 1/3.55 | 0.888 |
| 2nd Embodiment(ArF) | 1/4 | 1/3.53 | 0.883 |
| 3rd Embodiment(F$_2$) | 1/4 | 1/3.78 | 0.945 |
| 5th Embodiment | 1/4 | 1/3.42 | 0.855 |

Tables 9 and 10 show various values associated with the fifth embodiment.

Figure 19:
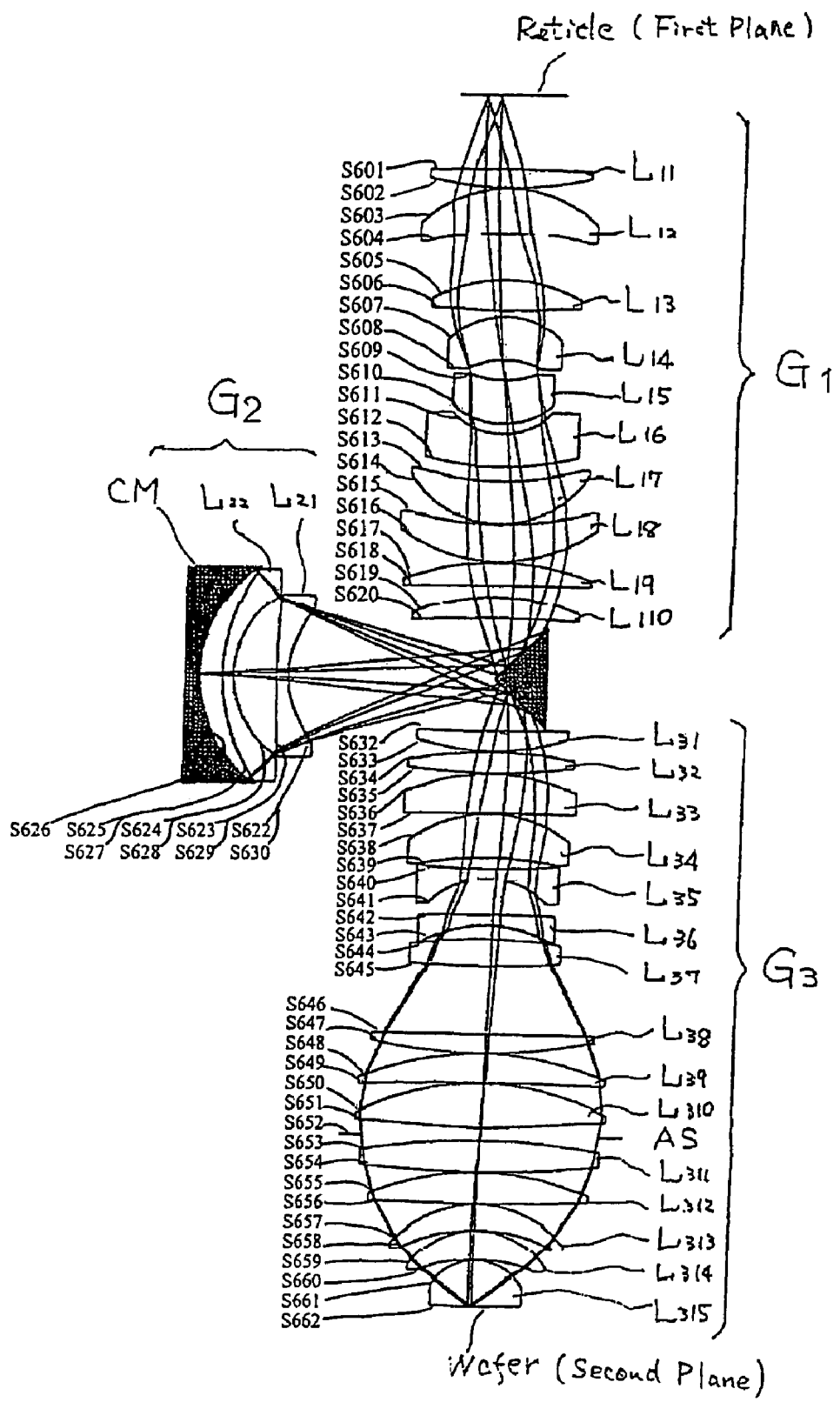
FIG. 19 illustrates the lens configuration of a fifth embodiment of the invention.

The following parameters apply in the fifth embodiment shown in FIG. 19:

NA (image side): 1.25
Magnification MA: ¼
Exposure area: A=3.5 mm, B=15.1 mm→rectangular area 26 mm×4 mm
Central Wavelength: 193.306 nm
Refractive index of silica glass: 1.5603261
Refractive index of purified water: 1.4368163
Dispersion of silica glass (dn/dλ): −1.591E-6/pm
Dispersion of purified water (dn/dλ): −2.096E-6/pm In the meantime one example of the immersion liquid for the photolithography machine using F$_2$ laser is perfluoropolyether (PFPE).

In the projection optical system PL in the fifth embodiment of FIG. 19, the first image forming optical system G1 comprises, sequentially from the reticle side, a positive lens L11 with a convex surface thereof directed toward the reticle; a positive meniscus lens L12 with a convex surface thereof directed toward the reticle; a biconvex lens L13 with wafer side aspheric surface; a positive meniscus lens L14 with a convex surface thereof directed toward the reticle; a positive meniscus lens L15 with a concave surface thereof directed toward the reticle; a negative meniscus lens L16 with a concave surface thereof directed toward the reticle; a positive meniscus lens L17 with concave surface thereof directed toward the reticle; a positive meniscus lens L18 with aspheric concave surface thereof directed toward the reticle; a positive lens L19; and a positive meniscus lens L110 with aspheric surface thereof directed toward the wafer.

The second image forming optical system G2 comprises, sequentially from the reticle side (i.e., from the incident side) along the forward running path of the light, a negative meniscus lens L21 with an aspherical concave surface thereof directed toward the reticle; a negative meniscus lens L22 with a concave surface thereof directed toward the reticle; and a concave reflector CM.

The third image forming optical system G3 comprises, sequentially from the reticle side in the running direction of the light, a positive meniscus lens L31 with a concave surface thereof directed toward the reticle; a biconvex lens L32; a positive lens L33; a positive meniscus lens L34 with an aspherical concave surface thereof directed toward the wafer; a biconcave negative lens L35 with an aspherical concave surface thereof directed toward the wafer; a negative meniscus lens L36 with an aspherical concave surface thereof directed toward the wafer; a biconvex lens L37; a positive lens L38 with an aspherical surface thereof directed toward the reticle; a positive meniscus lens L39 with a convex surface thereof directed toward the reticle; a positive lens L310 with an aspherical surface thereof directed toward the wafer; an aperture stop AS; a bicovex lens L311; a positive lens L312; a positive meniscus lens L313 with a concave aspheric surface thereof directed toward the wafer; a positive meniscus lens L314 with a concave aspheric surface thereof directed toward the wafer; and a flat-convex lens L315 (a boundary lens Lb) with a flat face thereof directed toward the wafer.

Figure 20:
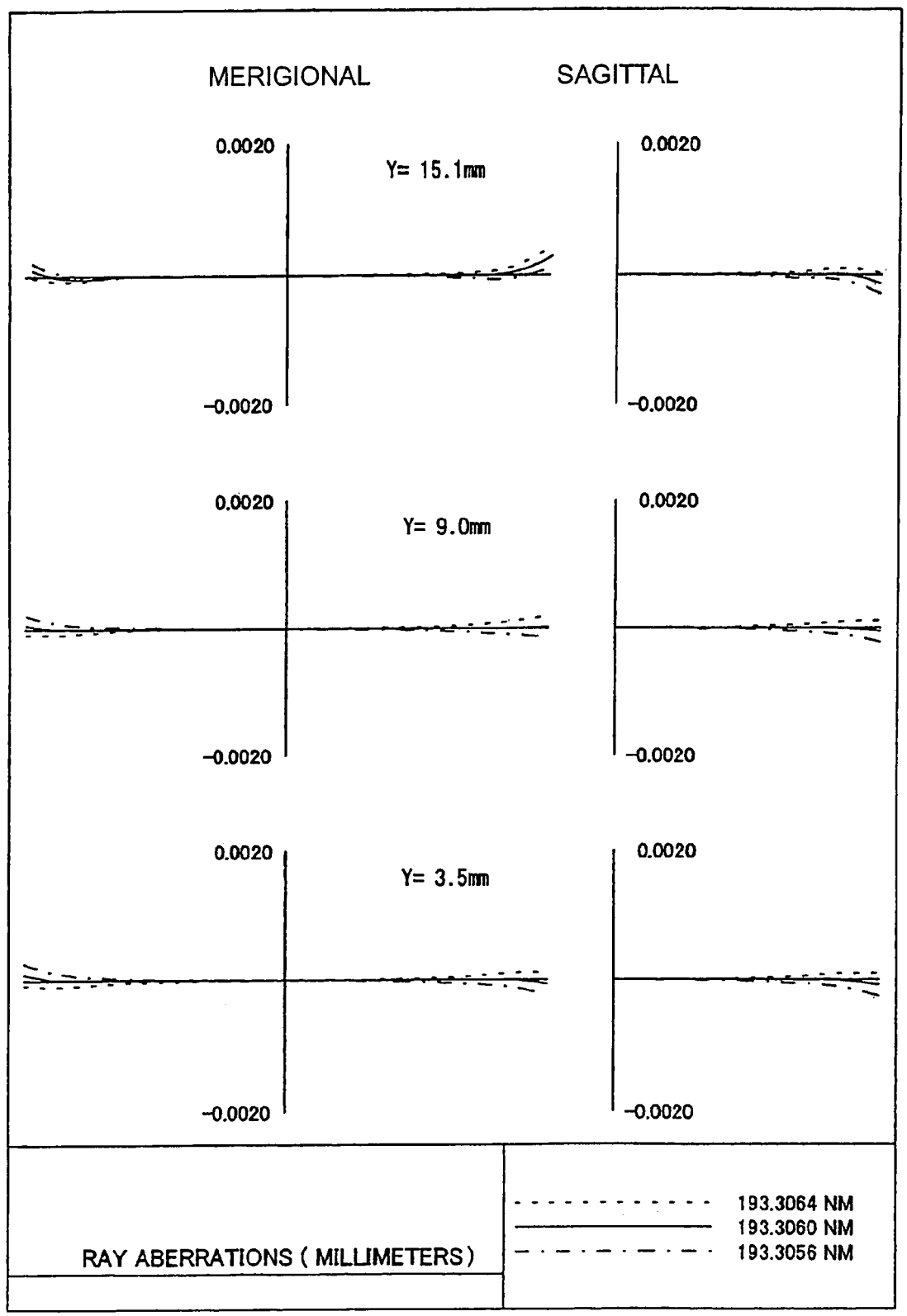
FIG. 20 illustrates graphs showing various aberrations of the fifth embodiment.

As is apparent from FIG. 20, the fifth embodiment achieves excellent correction for chromatic aberration within wavelength scope of ±0.4 pm.

TABLE 9

| Surface No. | r (mm) | d (mm) | Material |
|---|---|---|---|
| Object Plane | ∞ | 81.9091 | |
| 601: | 2634.49417 | 21.2504 | fused silica |
| 602: | −395.77168 | 1.0000 | |
| 603: | 150.00000 | 50.0000 | fused silica |
| 604: | 369.68733 | 54.9152 | |
| 605: | 179.71446 | 34.0868 | fused silica |
| 606: | ASP-1 | 6.6932 | |
| 607: | 88.93816 | 50.0000 | fused silica |
| 608: | 91.86919 | 23.6059 | |
| 609: | −98.63242 | 50.0000 | fused silica |
| 610: | −88.50693 | 12.0495 | |
| 611: | −76.47008 | 38.6573 | fused silica |
| 612: | −344.46033 | 15.7028 | |
| 613: | −334.92667 | 50.0661 | fused silica |
| 614: | −117.23873 | 1.0000 | |
| 615: | ASP-2 | 43.8716 | fused silica |
| 616: | −181.49712 | 1.0000 | |
| 617: | 289.19628 | 27.8483 | fused silica |
| 618: | 5892.12201 | 12.1517 | |
| 619: | 227.01362 | 27.1570 | fused silica |
| 620: | ASP-3 | 69.0000 | |
| 621: | ∞ | −236.5116 | (M1) |
| 622: | ASP-4 | −12.5000 | fused silica |
| 623: | 1144.45984 | −50.1326 | |
| 624: | 110.85976 | −12.5000 | fused silica |
| 625: | 213.24820 | −26.1588 | |

TABLE 9-continued

| Surface No. | r (mm) | d (mm) | Material |
|---|---|---|---|
| 630: | ASP-4 | 236.5116 | |
| 631: | ∞ | −64.0489 | (M2) |
| 632: | 3037.95158 | −22.3312 | fused silica |
| 633: | 259.31045 | −1.0000 | |
| 634: | −470.92323 | −24.5450 | fused silica |
| 635: | 700.75092 | −1.0000 | |
| 636: | −228.28898 | −45.9798 | fused silica |
| 637: | −4362.49907 | −1.0000 | |
| 638: | −147.00156 | −50.0000 | fused silica |
| 639: | ASP-5 | −13.1758 | |
| 640: | 810.59426 | −12.5000 | fused silica |
| 641: | ASP-6 | −40.9252 | |
| 642: | −2113.41076 | −12.5000 | fused silica |
| 643: | ASP-7 | −16.1803 | |
| 644: | −562.31334 | −30.6877 | fused silica |
| 645: | 1126.64825 | −80.2339 | |
| 646: | ASP-8 | −22.6585 | fused silica |
| 647: | 586.42327 | −1.0000 | |
| 648: | −361.03935 | −33.1534 | fused silica |
| 649: | −3170.02757 | −1.0000 | |
| 650: | −310.02927 | −49.2493 | fused silica |
| 651: | ASP-9 | −9.8682 | |
| 652: | ∞ | −5.3722 | Aperture Stop |
| 653: | −777.31707 | −35.8824 | fused silica |
| 654: | 1312.61222 | −1.0007 | |
| 655: | −319.73575 | −35.9439 | fused silica |
| 656: | 3225.49072 | −1.0000 | |
| 657: | −130.49530 | −28.4950 | fused silica |
| 658: | ASP-10 | −1.0000 | |
| 659: | −95.22134 | −34.3036 | fused silica |
| 660: | ASP-11 | −1.0000 | |
| 661: | −61.85167 | −50.0000 | fused silica |
| 662: | ∞ | −1.0000 | deionized water |
| image plane | ∞ | | |

TABLE 10

| Aspheric No. | Curvature (CURV) | K<br>E | A<br>F | B<br>G | C<br>H | D<br>J |
|---|---|---|---|---|---|---|
| ASP-1 | −0.00209291 | 0 | $7.81812 \times 10^{-8}$ | $6.03387 \times 10^{-13}$ | $3.16794 \times 10^{-16}$ | $-3.45599 \times 10^{-20}$ |
|  |  | $1.67268 \times 10^{-24}$ | 0 | 0 | 0 | 0 |
| ASP-2 | −0.00252981 | 0 | $-1.14607 \times 10^{-08}$ | $4.60861 \times 10^{-13}$ | $-1.61766 \times 10^{-17}$ | $-5.41414 \times 10^{-24}$ |
|  |  | $5.36076 \times 10^{-27}$ | $-1.16131 \times 10^{-31}$ | 0 | 0 | 0 |
| ASP-3 | 0.00029038 | 0 | $1.29530 \times 10^{-08}$ | $2.79320 \times 10^{-13}$ | $-1.95862 \times 10^{-17}$ | $6.49032 \times 10^{-22}$ |
|  |  | $-1.02409 \times 10^{-26}$ | $-4.06450 \times 10^{-32}$ | 0 | 0 | 0 |
| ASP-4 | 0.00934352 | 0 | $-8.88014 \times 10^{-08}$ | $-3.40911 \times 10^{-12}$ | $-1.98985 \times 10^{-16}$ | $-1.45801 \times 10^{-20}$ |
|  |  | $-9.23066 \times 10^{-26}$ | $-1.30730 \times 10^{-28}$ | 0 | 0 | 0 |
| ASP-5 | −0.00197848 | 0 | $-3.21829 \times 10^{-08}$ | $4.08976 \times 10^{-13}$ | $9.46190 \times 10^{-17}$ | $-1.12686 \times 10^{-20}$ |
|  |  | $1.09349 \times 10^{-24}$ | $-2.30304 \times 10^{-29}$ | 0 | 0 | 0 |
| ASP-6 | −0.0104007 | 0 | $-1.40846 \times 10^{-08}$ | $3.73235 \times 10^{-12}$ | $5.78170 \times 10^{-17}$ | $4.02044 \times 10^{-20}$ |
|  |  | $1.81116 \times 10^{-24}$ | $-3.46502 \times 10^{-28}$ | 0 | 0 | 0 |
| ASP-7 | −0.00689746 | 0 | $3.76564 \times 10^{-08}$ | $2.04565 \times 10^{-12}$ | $6.72661 \times 10^{-17}$ | $3.35779 \times 10^{-21}$ |
|  |  | $-5.51576 \times 10^{-25}$ | $2.95829 \times 10^{-28}$ | 0 | 0 | 0 |
| ASP-8 | −0.00029365 | 0 | $1.54429 \times 10^{-08}$ | $-1.52631 \times 10^{-13}$ | $-1.17235 \times 10^{-17}$ | $-3.02626 \times 10^{-22}$ |
|  |  | $-2.05070 \times 10^{-28}$ | $3.61487 \times 10^{-31}$ | 0 | 0 | 0 |
| ASP-9 | 0.00123523 | 0 | $-9.78469 \times 10^{-09}$ | $2.15545 \times 10^{-14}$ | $-2.66488 \times 10^{-17}$ | $1.19902 \times 10^{-21}$ |
|  |  | $-2.50321 \times 10^{-26}$ | $2.10016 \times 10^{-31}$ | 0 | 0 | 0 |
| ASP-10 | −0.00508157 | 0 | $2.76215 \times 10^{-09}$ | $-4.06793 \times 10^{-12}$ | $4.51389 \times 10^{-16}$ | $-5.07074 \times 10^{-20}$ |
|  |  | $1.83976 \times 10^{-24}$ | $-6.22513 \times 10^{-29}$ | 0 | 0 | 0 |
| ASP-11 | −0.00460959 | 0 | $-1.08228 \times 10^{-07}$ | $-9.51194 \times 10^{-12}$ | $1.14605 \times 10^{-15}$ | $-1.27400 \times 10^{-19}$ |
|  |  | $1.59438 \times 10^{-23}$ | $-5.73173 \times 10^{-28}$ | 0 | 0 | 0 |

TABLE 9-continued

| Surface No. | r (mm) | d (mm) | Material |
|---|---|---|---|
| 626: | 155.15866 | 26.1588 | (CM) |
| 627: | 213.24820 | 12.5000 | fused silica |
| 628: | 110.85976 | 50.1326 | |
| 629: | 1144.45984 | 12.5000 | fused silica |

The exposure apparatus in the above-mentioned embodiments makes it possible to manufacture microdevices (such as semiconductor devices, image pickup devices, liquid crystal display devices and thin-film magnetic heads) by illuminating a reticle (mask) by an illuminating apparatus (illuminating step), and exposing a pattern for transfer formed on the mask onto a photosensitive substrate by means of a projection optical system. A typical technique for obtaining a semiconductor device as a microdevice by forming a prescribed circuit pattern on a photosensitive substrate such as a wafer by using the exposure apparatus of this embodiment will be described with reference to a flowchart shown in FIG. 17.

Figure 17:
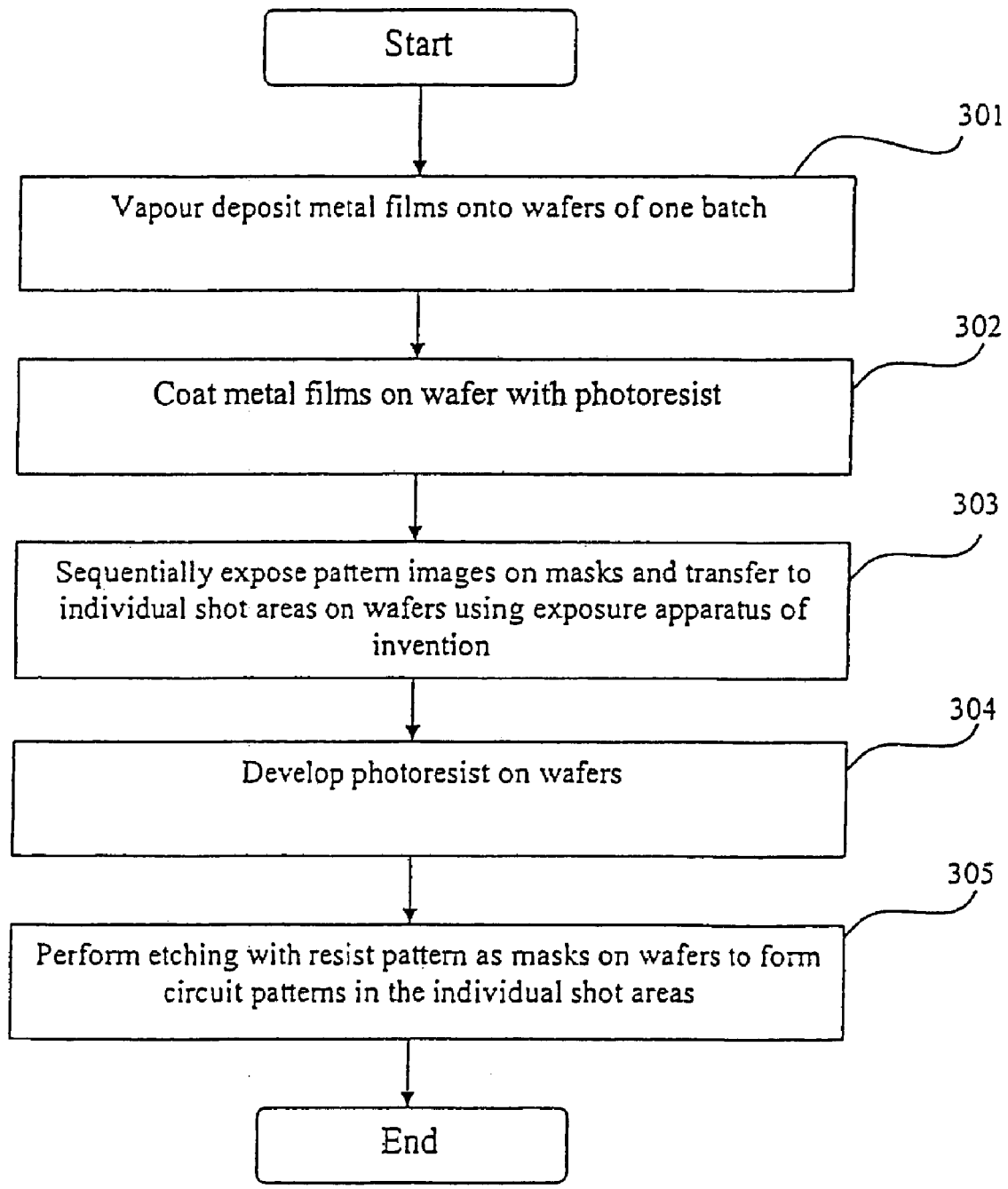
FIG. 17 is a flowchart of the technique used when obtaining a semiconductor device as a microdevice.

In step 301 shown in FIG. 17, metal films are vapor-deposited onto wafers of one batch. In the next step 302, photoresist is coated onto these metal films on the wafers of the batch. Subsequently in step 303, the pattern images on the masks are sequentially exposed and transferred in the individual shot areas on the wafers of the batch by using the exposure apparatus of this embodiment. Thereafter, after development of the photoresist on the wafers of the batch in step 304, circuit patterns corresponding to the patterns on the masks are formed in the individual shot areas on the wafers by conducting etching with the resist patterns as masks on the wafers of the batch.

Then, a device such as a semiconductor device is manufactured by forming the circuit pattern of an upper layer. According to the above-mentioned semiconductor device manufacturing method, a semiconductor device having a very fine circuit pattern can be obtained at a high throughput. In steps 301 to 305, a metal is vapor-deposited on the wafer; a resist is coated onto the metal film; and exposure, development and etching steps are performed. Prior to performing these steps, after forming a silicon oxide film on the wafer, resist may be coated onto the silicon oxide film, followed by exposure, development and etching steps.

Figure 18:
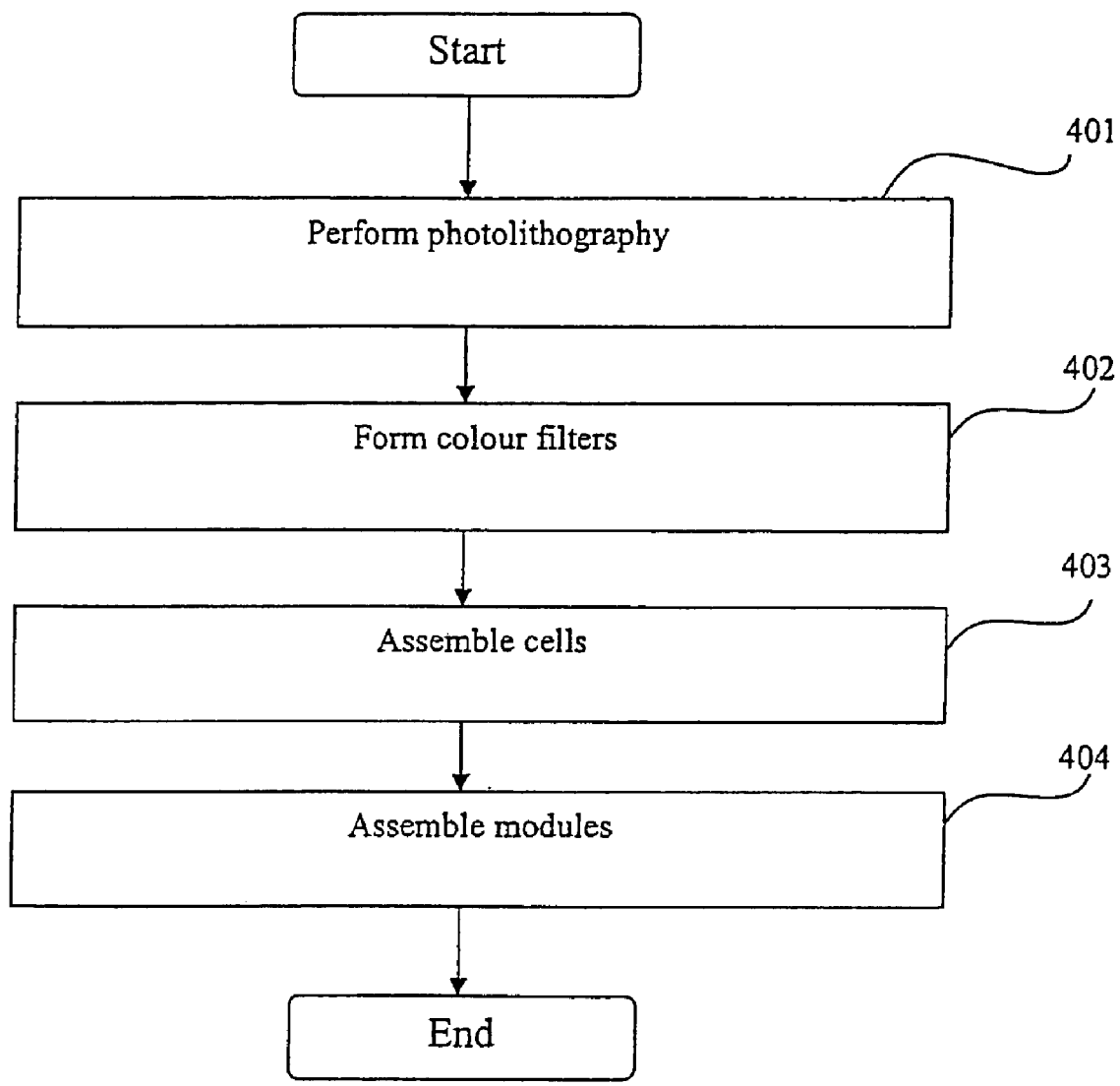
FIG. 18 is a flowchart of the technique used when obtaining a liquid crystal display device as a microdevice.

According to the exposure apparatus of this embodiment, it is possible to obtain a liquid crystal display device as a microdevice by forming a prescribed pattern (a circuit pattern, an electrode pattern or the like) on a plate (glass substrate). A typical technique applied at this stage will be described with reference to the flowchart shown in FIG. 12. In FIG. 18, in the pattern forming step 401, a photolithographic step is executed through transfer and exposure of the pattern of the mask onto the photosensitive substrate (a glass substrate having a resist coated thereon, or the like) by using the exposure apparatus of this embodiment. As a result of this photolithographic process, many prescribed patterns including electrodes and the like are formed on the photosensitive substrate. The prescribed patterns are formed on the exposed substrate through steps such as developing, etching and resist stripping steps, and the process advances to the next color filter forming step 402.

Then, in the color filter forming step 402, many sets of these kinds of dots including R (red), G (green) and B (blue) are arranged in a matrix shape, or a plurality of sets of stripe filters of R, G and B are arranged in the horizontal scanning lines, to form a color filter. After the color filter forming step 402, a cell assembling step 403 is executed. In the cell assembling step 403, a liquid crystal panel (liquid crystal cell) is assembled by using the substrate having prescribed patterns resulting from the pattern forming step 401, and the color filter obtained in the color filter forming step 402. In the cell assembling step 403, a liquid crystal is injected into the space between, for example, the substrate having the prescribed patterns resulting from the pattern forming step 401 and the color filter obtained in the color filter forming step 402, to manufacture a liquid crystal panel (liquid crystal cell).

Subsequently, in a module assembling step 404, component parts such as an electric circuit causing the assembled liquid crystal panel (liquid crystal cell) and backlights are attached, thus completing a liquid crystal display device. According to the above-mentioned manufacturing method of liquid crystal display devices, it is possible to obtain a liquid crystal display device having very fine circuit patterns at a high throughput.

In the aforementioned embodiments, the present invention is applied to the exposure apparatus based on the step-and-scan process in which a mask pattern is scanned and exposed to exposure areas of the substrate while moving the mask and substrate relative to the projection optical system. The present invention is not however limited to this, but is applicable also to an exposure apparatus of the step-and-repeat process in which the mask pattern is transferred in a lump onto the substrate in a stationary state of the mask and the substrate, and the mask patterns are sequentially exposed onto the exposure areas by successively moving the substrate stepwise.

In the aforementioned embodiments, an ArF excimer laser source or an $F_2$ laser source is used. The present invention is not however limited to this, but other appropriate light source may be employed. The present invention is applied in the aforementioned embodiments to a projection optical system mounted on an exposure apparatus. While the present invention is applied to a projection optical system mounted on an exposure apparatus, the present invention is not limited to this, but is applicable also to other popularly used projection optical systems.

According to the projection optical of the present invention, as described above, occurrence of reflection loss on an optical face can be satisfactorily inhibited, and a large effective image-side numerical aperture can be maintained by providing a medium having a high refractive index in the optical path to the image field, and imparting a positive refractive power onto the face of the boundary lens on the object side.

Therefore, in the exposure apparatus and the exposing method using the projection optical system of the present invention, a fine pattern can be transferred and exposed at a high accuracy via the projection optical system having a large and effective image-side numerical aperture and a high resolution. A satisfactory microdevice through high-accuracy projection and exposure via a high-resolution projection optical system by using an exposure apparatus mounting the projection optical system of the present invention.

The invention claimed is:

1. A liquid immersion optical system comprising:
   a first optically transparent member;
   a second optically transparent member, arranged in an optical path between the first optically transparent member and an object,
   wherein a first space between the first optically transparent member and the second optically transparent member is fillable with a first liquid,
   wherein a second space between the second optically transparent member and the object is fillable, with a second liquid, and
   wherein the second optically transparent member is detachably arranged in the optical path between the first optically transparent member and the object.

2. The liquid immersion optical system according to claim 1, wherein the object is optically conjugate with another object by the optical system.

3. The liquid immersion optical system according to claim 2, wherein the first and second liquids are a same type of liquid.

4. The liquid immersion optical system according to claim 1, wherein the liquid immersion optical system satisfies the condition as expressed by:

$$|PD| < 1.0 \times 10^{-4}$$

where P represents a refractive power of the second optically transparent member, and D represents a distance between an optical axis of the liquid immersion optical system and an outermost point of an irradiation area on the object.

5. The liquid immersion optical system according to claim 4, wherein an image of another object is projected on the irradiation area.

6. The liquid immersion optical system according to claim 1, wherein the second optically transparent member comprises an adjustable orientation.

7. The liquid immersion optical system according to claim 1, which satisfies the condition as expressed by:

$$0.012 < Cb*D/NA < 0.475$$

where Cb represents a curvature of a surface of the first optically transparent member which faces to opposite side of the object; D represents a distance between an optical axis of the liquid immersion optical system and an outermost point of an irradiation area on the object, and NA represents the numerical aperture on the object side of the liquid immersion optical system.

8. The liquid immersion optical system according to claim 7, wherein an image of another object is projected on the irradiation area.

9. An apparatus comprising:
a substrate stage; and
a projection optical system including the liquid immersion optical system according to claim 1,
wherein the projection optical system projects an image of a pattern onto a substrate on the substrate stage.

10. A method comprising:
illuminating a pattern; and
projecting an image of the pattern with a light beam which passed through the liquid immersion optical system according to claim 1.

11. The method according to claim 10, comprising preparing a photosensitive substrate, wherein the image of the pattern is projected onto the photosensitive substrate, the method further comprising developing the photosensitive substrate.

12. A liquid immersion optical system comprising:
an optical axis;
a first optically transparent member aligned with the optical axis; and
a second optically transparent member, arranged in an optical path between the first optically transparent member and an object, and aligned with the optical axis,
wherein a first space between the first optically transparent member and the second optically transparent member is fillable with a first liquid,
wherein a second space between the second optically transparent member and the object is fillable with a second liquid, and
wherein a distance of the first space along the optical axis is smaller than a distance of the second space along the optical axis.

13. The liquid immersion optical system according to claim 12, wherein the first optically transparent member includes a lens with a liquid immerged surface.

14. The liquid immersion optical system according to claim 13, wherein the lens includes a flat optical surface facing to the first space.

15. The liquid immersion optical system according to claim 14, wherein the second optically transparent member includes a plane parallel plate.

16. The liquid immersion optical system according to claim 15, wherein the object is optically conjugate with another object by the optical system.

17. The liquid immersion optical system according to claim 13, wherein the lens includes a concave optical surface facing to the first space.

18. An apparatus comprising:
a substrate stage; and
a projection optical system including the liquid immersion optical system according to claim 12,
wherein the projection optical system projects an image of a pattern onto a substrate on the substrate stage.

19. A method comprising:
illuminating a pattern; and
projecting an image of the pattern with a light beam which passed through the liquid immersion optical system according to claim 12.

20. The method according to claim 19, comprising preparing a photosensitive substrate, wherein the image of the pattern is projected onto the photosensitive substrate, the method further comprising developing the photosensitive substrate.

21. A liquid immersion optical system comprising:
an optical axis;
a first optically transparent member aligned with the optical axis; and
a second optically transparent member, arranged in an optical path between the first optically transparent member and an object, and aligned with the optical axis,
wherein a first space between the first optically transparent member and the second optically transparent member is fillable with a first liquid,
wherein a second space between the second optically transparent member and the object is fillable with a second liquid, and
wherein a distance of the first space along the optical axis is smaller than a thickness of the second optically transparent member along the optical axis.

22. The liquid immersion optical system according to claim 21, wherein the first optically transparent member includes a lens with a liquid immerged surface.

23. The liquid immersion optical system according to claim 22, wherein the lens includes a flat optical surface facing to the first space.

24. The liquid immersion optical system according to claim 23, wherein the second optically transparent member includes a plane parallel plate.

25. The liquid immersion optical system according to claim 24, wherein the object is optically conjugate with another object by the optical system.

26. The liquid immersion optical system according to claim 22, wherein the lens includes a concave optical surface facing to the first space.

27. An apparatus comprising:
a substrate stage; and
a projection optical system including the liquid immersion optical system according to claim 21,
wherein the projection optical system projects an image of a pattern onto a substrate on the substrate stage.

28. A method comprising:
illuminating a pattern; and
projecting an image of the pattern with a light beam which passed through the liquid immersion optical system according to claim 21.

29. The method according to claim 28, comprising preparing a photosensitive substrate, wherein the image of the pattern is projected onto the photosensitive substrate, the method further comprising developing the photosensitive substrate.

* * * * *